United States Patent
Okushima

(10) Patent No.: US 7,183,612 B2
(45) Date of Patent: Feb. 27, 2007

(54) SEMICONDUCTOR DEVICE HAVING AN ELECTROSTATIC DISCHARGE PROTECTING ELEMENT

(75) Inventor: Mototsugu Okushima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/014,702

(22) Filed: Dec. 20, 2004

(65) Prior Publication Data

US 2005/0133839 A1    Jun. 23, 2005

(30) Foreign Application Priority Data

Dec. 19, 2003    (JP)    ............... 2003-422108

(51) Int. Cl.
*H01L 27/02*    (2006.01)
(52) U.S. Cl. .................. 257/350; 257/E27.03; 438/190
(58) Field of Classification Search ........ 257/355–363, 257/E29.325, 173, 350, E27.016, E27.03; 361/100, 101; 438/171, 190, 210, 238, 329, 438/330
See application file for complete search history.

(56) References Cited

U.S. PATENT DOCUMENTS

| | | | | |
|---|---|---|---|---|
| 5,811,856 A | * | 9/1998 | Lee | .............. 257/355 |
| 5,844,281 A | * | 12/1998 | Narita | ............... 257/356 |
| 6,587,320 B1 | * | 7/2003 | Russ et al. | .............. 361/56 |
| 2003/0227053 A1 | * | 12/2003 | Nomura et al. | ........... 257/344 |
| 2004/0164354 A1 | * | 8/2004 | Mergens et al. | ............ 257/355 |
| 2005/0045952 A1 | * | 3/2005 | Chatty et al. | ............... 257/355 |

FOREIGN PATENT DOCUMENTS

| | | |
|---|---|---|
| JP | 02-271674 | 11/1990 |
| JP | 2773221 | 4/1998 |
| JP | 2001-284583 | 10/2001 |

OTHER PUBLICATIONS

By Koen G. Verhaege and Christian C. Russ, "Wafter Cost Reduction through Design of High Performance Fuly Silicided EDS Devices", EOS/ESD Symposium, 2000, No. 18, pp. 1A.3.1 to 1A.3.11.

* cited by examiner

*Primary Examiner*—Eugene Lee
*Assistant Examiner*—William F. Kraig
(74) *Attorney, Agent, or Firm*—Young & Thompson

(57) ABSTRACT

In an ESD protecting element, a plurality of source regions and a plurality of ballast resistor regions are formed. A drain region is formed at a region which is in contact with a channel region in the ballast resistor region, and an $n^+$ type diffusion region is formed at a region isolated from the drain region via an STI region. A third contact is provided on the drain region, first and second contacts are formed on the $n^+$ type diffusion region, and the first contact is connected to a pad. The second contact is coupled to the third contact by a metal wire. The first and second contacts are laid out along the widthwise direction of a gate.

29 Claims, 19 Drawing Sheets

SEMICONDUCTOR DEVICE HAVING AN ELECTROSTATIC DISCHARGE PROTECTING ELEMENT

BACKGROUND OF THE INVENTION

1. Field of the Invention

The present invention relates to a semiconductor device having an ESD (Electro Static Discharge) protecting element. The invention can be applied to a semiconductor device which needs a constant resistance in a limited area, and can be suitably applied to, particularly, a case where the ballast resistance of the ESD protecting element is provided.

2. Description of The Related Art

With the recent enhancement of the functions and the performance of semiconductor devices, there is a demand for multi-pin semiconductor devices which have over several thousand I/O (Input/Output) pins. Accordingly, the area of a single I/O block considerably influences the downsizing and cost reduction of the overall semiconductor device. Elements which have a large ratio of occupying the area of the I/O block are an ESD protecting element and a driver element of high drive power. A multi-finger type protecting element which has a plurality of MOS (Metal Oxide Semiconductor) transistors (fingers) with a gate width of several ten micrometers connected in parallel is used as the ESD protecting element.

FIG. 1 is a graph showing the operational characteristic of an ESD protecting element with a voltage to be applied to the ESD protecting element taken on the horizontal axis and a current flowing through the ESD protecting element taken on the vertical axis. FIG. 1 is an exemplary diagram so that the sizes of the voltage and the current should not necessarily match with actual measurements.

As shown in FIG. 1, there are two types of voltages which are actually applied to an ESD protecting element, a voltage in the direction where snap-back occurs and a voltage in the direction where snap-back does not occur. The voltage in the direction where snap-back occurs is a voltage in the direction where the amount of the flowing current can be changed by controlling the gate voltage, i.e., a voltage in the direction in which the voltage is applied at the time of operating the ESD protecting element. In case of an NMOS transistor, for example, it is a voltage in the direction where the drain becomes a positive potential and the source becomes a negative potential. In case of a PMOS transistor, it is a voltage in the direction where the source becomes a positive potential and the drain becomes a negative potential. The voltage in the direction where snap-back does not occur is a voltage which is applied in the opposite direction to the voltage in the direction where snap-back occurs.

For the object of descriptive simplicity, in the following description, the voltage in the direction where snap-back occurs will be called a "positive ESD voltage" and the current flowing in this direction will be called a "positive ESD current", while the voltage in the direction where snap-back does not occur will be called a "negative ESD voltage" and the current flowing in this direction will be called a "negative ESD current". As how snap-back occurs normally matters in the discussions on an ESD protecting element, the positive ESD voltage is often discussed. In the present specification, the ESD voltage is a positive ESD voltage and the ESD current is a positive ESD current unless the positive or negative polarity is specifically mentioned.

As indicated by a solid line 101 in FIG. 1, the current monotonously increases with respect to the voltage within a range where the voltage to be applied to the ESD protecting element is low, but when the voltage exceeds a given threshold, a parasitic bipolar transistor whose drain region, channel region and source region respectively become the collector, the base and the emitter is formed in the MOS transistor. As the parasitic bipolar transistor operates, the ESD protecting element snaps back to reduce the resistance, so that a large current flows into the ESD protecting element. If the ESD protecting element is comprised of an MOS transistor alone which is formed by a salicide process (self-align silicide process), the operational characteristic becomes as indicated by a broken line 102.

In this case, however, a problem would arise. As shown in FIG. 1, provided that the maximum allowable current per one finger in multiple fingers is X, when the characteristic of each finger is as indicated by the broken line 102, the first finger that has snapped back is broken by the current that flows in this finger. In this respect, a ballast resistance is added to the drain of the MOS transistor to set the characteristic of each finger to the one shown by a broken line 103. That is, a breakdown voltage $V_{B1}$ over which a finger is broken is set higher than a snap-back start voltage $V_{SP1}$. With the design, before the first finger that has snapped back is broken, the other fingers sequentially snap back, thus letting the ESD current to flow. Therefore, the current does not concentrate on one finger so that the overall ESD protecting element would not be broken.

As well known, with the scale of integration of semiconductor elements becoming higher, silicide is formed at the top surfaces of the gate electrode and the source region and the drain region. As the silicide has a low surface resistance, the operational characteristic of the ESD protecting element becomes as indicated by the broken line 102 in FIG. 1, which would raise a problem in view of protection against ESD.

Japanese Patent No. 2773221 discloses a technique of setting a region where no silicide is formed or a silicide blocking region in the drain region, thereby increasing the resistance of the drain region. FIG. 2 is a plan view showing a conventional ESD protecting element described in Japanese Patent No. 2773221. As shown in FIG. 2, this conventional ESD protecting element, 111, has a source region 112 and a drain region 113 provided at the top surface of a semiconductor substrate. A gate 114 is provided on a region between the source region 112 and the drain region 113. A silicide blocking region 115 is provided at the top surface of the drain region 113. A Ti silicide 116 is formed in the other regions of the top surfaces of the source region 112, the gate 114 and the drain region 113 than the silicide blocking region 115. This increases the resistance of the drain region, and adds a ballast resistance.

Japanese Patent Laid-Open Publication No. 2001-284583 discloses a technique of adding a ballast resistance by using a well resistor. That is, a deep drain diffusion region is formed at the top surface of the silicon substrate. Then, a trench isolation layer is formed in such a way as to separate the deep drain diffusion region and the salicide formed at the top surface thereof into two parts, one on the channel side and the other on the contact side. At this time, the trench isolation layer is formed shallower than the drain diffusion region, and a current path is formed in the drain diffusion region in such a way as to go around the lower portion of the trench isolation layer. Japanese Patent Laid-Open Publication No. 2001-284583 describes that the design can add a ballast resistance to the current path of the ESD current and the snap-back voltage can be controlled by controlling the size and the position of the trench isolation layer.

A literature 'Koen G. Verhaege and Christian C. Russ, "Wafer Cost Reduction through Design of High Performance Fully silicided ESD Devices", EOS/ESD Symposium 2000, p. 18–28' discloses a technique of connecting a resistor of polysilicon to the drain region. FIG. 3 is a cross-sectional view showing the conventional ESD protecting element. As shown in FIG. 3, in the conventional ESD protecting element, 120, a P well 133 is formed at the top surface of a P type silicon substrate 121, and a source region 122 which is an $n^+$ type diffusion region, a gate 123 and a drain region 124 which is an $n^+$ type diffusion region are formed at the top surface of the P well 133, thereby forming an MOS transistor 125. The drain region 124 is connected to one end of a resistor 129 via a contact 126, a wire 127 and a contact 128. The other end of the resistor 129 is connected to a pad 131 via a contact 130. The resistor 129 is formed on a device isolation layer 132 formed at the top surface of the silicon substrate 121, and is insulated from the silicon substrate 121 by the device isolation layer 132. A $p^+$ type diffusion region 134 is formed at the top surface of the P well 133, and is applied with the ground potential. The literature describes that a ballast resistance can be added by the resistor 129 of polysilicon.

The prior arts however have the following problems. First, according to the technique described in Japanese Patent No. 2773221 which forms a ballast resistor with a silicide blocking region, the sheet resistance of the silicide blocking region is 200Ω/□ or so, so that when the total gate width of the ESD protecting element is 600 μm, the width of the silicide blocking region should be set to 2 μm in order to form a ballast resistor of 0.6Ω. To acquire a large ballast resistance required, therefore, the source and drain gap becomes larger to, for example, 3 to 4 μm or so. The technique requires a special step of forming the silicide blocking region.

According to the technique described in Japanese Patent Laid-Open Publication No. 2001-284583 which forms a ballast resistor with the resistance of a drain diffusion region, it is necessary to form the drain diffusion region deep. A thick resist is therefore needed at the time of forming the drain diffusion region deep. This makes it difficult to control the horizontal shape precisely and stands in the way of designing the element compact.

The technique disclosed in the literature by Koen G. Verhaege and Christian C. Russ which forms a ballast resistor with a resistor of polysilicon has a problem that when a negative ESD current is supplied to the pad 131, a resistance is added to the current path of the ESD current as shown in FIG. 3. In the ESD protecting element 120, a PN diode is formed between the P type silicon substrate 121 and the $n^+$ type drain region 124. When a negative ESD current is supplied to the pad 131, the current flows in the path of the P well 133—drain region 124—contact 126—wire 127—contact 128—resistor 129—contact 130—pad 131, as indicated by arrows in FIG. 3, a resistance provided by the resistor 129 is added to the current path. When a negative ESD current is supplied to the pad 131, however, the ESD protecting element does not snap back, no ballast resistor is required, and the ballast resistor, if present, would reduce the protection performance. In other words, the conventional ESD protecting element has a low protection performance against a negative ESD current.

SUMMARY OF THE INVENTION

It is an object of the present invention to provide a semiconductor device which can be miniaturized, does not require a special step at the time of fabrication and shows a sufficient protection performance even against a negative ESD current.

A semiconductor device according to the invention includes a semiconductor substrate. A top surface of the semiconductor substrate is a first conductivity type. And, the semiconductor device includes a second conductivity type transistor which is formed at the top surface of the semiconductor substrate. The semiconductor device includes: a second conductivity type diffusion layer formed at a position insulated from the second conductivity type transistor at the top surface of the semiconductor substrate; a wire; a first contact which couples a pad to the second conductivity type diffusion layer; a second contact which couples the second conductivity type diffusion layer to the wire; and a third contact which couples the wire to one of source and drain of the second conductivity type transistor.

According to the invention, the first contact, the second conductivity type diffusion layer, the second contact, the wire and the third contact are coupled in series between the pad and the one of the source and drain. When a positive ESD current is supplied to the pad, therefore, a contact resistance can be added between the pad and the other one of the source and the drain while keeping the substantial element length to be discussed later small as compared with those in the prior arts. When a negative ESD current is supplied to the pad, the current flows in the current path which is formed by the top surface of the semiconductor substrate, the second conductivity type diffusion layer and the first contact, so that the resistance of the current path is low. Further, the first to third contacts can be formed in the normal contact fabrication process and do not require a special step.

It is preferable that a direction from the first contact toward the second contact is a widthwise direction of a gate of the second conductivity type transistor. The widthwise direction of the gate is a direction orthogonal to the direction from the source toward the drain. Accordingly, the current path in the second conductivity type diffusion layer runs in the direction orthogonal to the direction from the source to the drain, so that the ballast resistor can be added with the diffusion layer resistor without increasing the distance between the source and drain. Because individual fingers can be arranged close to one another as will be discussed later, the substrate coupling effect becomes greater and the resistance of the ballast resistor can be made relatively lower.

The semiconductor device may further include an integrated circuit portion coupled to the pad in parallel to the second conductivity type transistor. When an electrostatic discharge current is input to the pad, the second conductivity type transistor allows the electrostatic discharge current to flow. This can protect the integrated circuit portion against ESD. At this time, the pad may also serve as the output pad of the integrated circuit portion or may serve as an input pad. The pad may be a power supply pad of the integrated circuit portion.

A plurality of the second conductivity type transistors may be laid out along a lengthwise direction of gates thereof, every adjoining two of the second conductivity type transistors may make a pair, and a source region may be commonized for those second conductivity type transistors which form each pair. Accordingly, a multi-finger type-ESD protecting element can be formed.

In every adjoining two of the second conductivity type transistors of which source regions are not commonized, the wire and the second conductivity type diffusion layer may be commonized. This can further make the layout area smaller.

In every adjoining two of the second conductivity type transistors of which source regions are not commonized, the first and second contacts may be commonized. This can further make the layout area smaller.

The semiconductor device may further include: another second conductivity type diffusion layer formed at a position insulated from the second conductivity type transistor and the second conductivity type diffusion layer at the top surface of the semiconductor substrate; another wire; a fourth contact which couples a pad to the another second conductivity type diffusion layer; and a fifth contact which couples the another second conductivity type diffusion layer to the another wire. And, the first contact couples the another wire to the second conductivity type diffusion layer for coupling the pad to the second conductivity type diffusion layer. This can make the resistance to be added to the other one of the source and the drain higher.

Another semiconductor device according to the invention includes: a first conductivity type region formed at a top surface of a semiconductor substrate; a gate insulating layer formed at a top surface of the first conductivity type region; a gate electrode provided on the gate insulating layer; first and second second conductivity type regions respectively formed on both sides of a region directly underlying the gate electrode in the first conductivity type region; a third second conductivity type region formed at a position insulated and isolated from the first and second second conductivity type region in the first conductivity type region by an insulating layer; a wiring layer provided on the first conductivity type region; first and second contacts provided on the third second conductivity type region; and a third contact provided on the second second conductivity type region. The first and second contacts are laid out at positions apart from each other. The third second conductivity type region is coupled to a pad via the first contact. The third second conductivity type region is coupled to the second second conductivity type region via the second contact, the wiring layer and the third contact.

A further semiconductor device according to the invention includes a pad, a resistor and a transistor. And, the resistor and the transistor are coupled in series with the pad. The resistor is located so that a direction of a current flowing through the resistor is a widthwise direction of a gate of the transistor.

In the instant case, the resistor may be a diffusion layer. The further semiconductor device further includes a wire and contacts. The contacts are coupled between one of source and drain of the transistor and the wire, between the wire and the diffusion layer, and between the diffusion layer and the pad, respectively.

According to the invention, the first to third contacts and the second conductivity type diffusion layer are coupled between the pad and one of the source and drain, so that a ballast resistance using the contact resistance can be added between the pad and one of the source and the drain. When a second conductivity type transistor is used as the ESD protecting element, therefore, it is possible to acquire an ESD protecting element whose substantial element length is small, and which has a small layout area required and a high protection performance even against a negative ESD current, without involving a special step.

BRIEF DESCRIPTION OF THE DRAWINGS

FIGS. 11A and 11B are plan views for explaining the effect of the embodiment, FIG. 11A showing an ESD protecting element where a current path in an $n^+$ type diffusion region is formed in the widthwise direction of the gate while FIG. 11B shows an ESD protecting element where the current path in the $n^+$ type diffusion region is formed in the lengthwise direction of the gate;

DETAILED DESCRIPTION OF THE PREFERRED EMBODIMENTS

Figure 4:
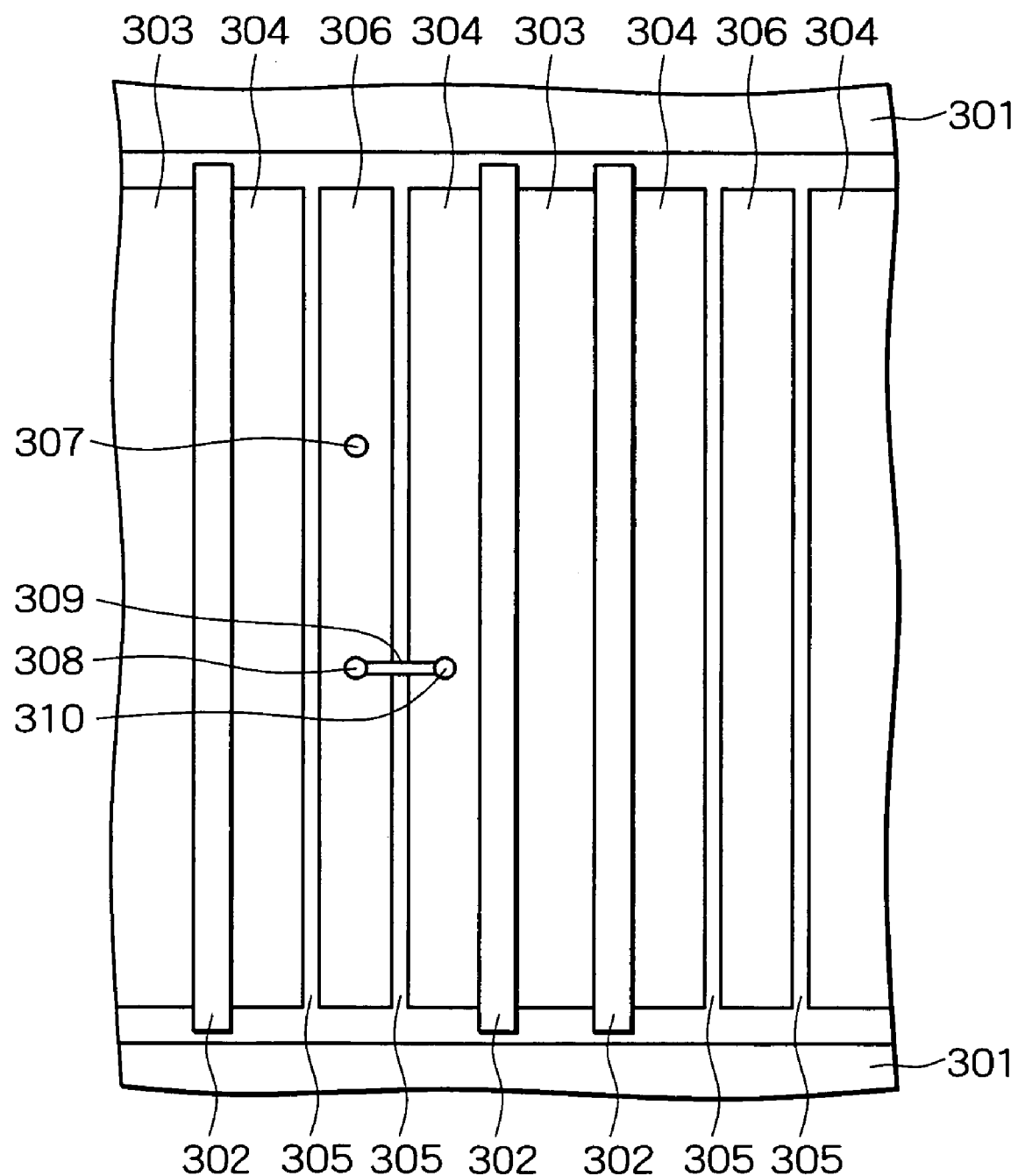
FIG. 4 is a plan view exemplarily illustrating the principle of a first embodiment of the present invention.
Figure 5:
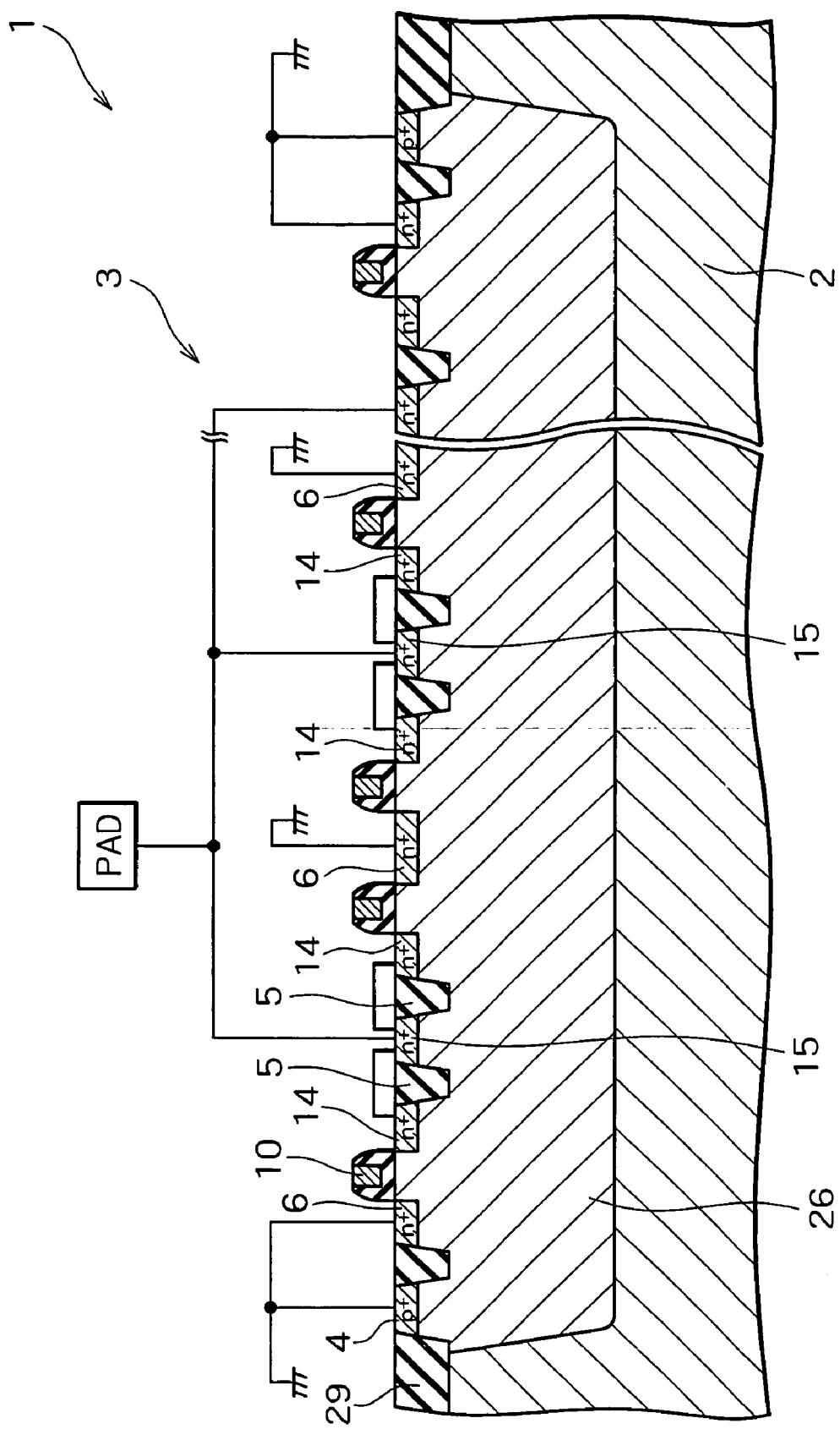
FIG. 5 is a cross-sectional view showing a part of a semiconductor device according to the embodiment.
Figure 6:
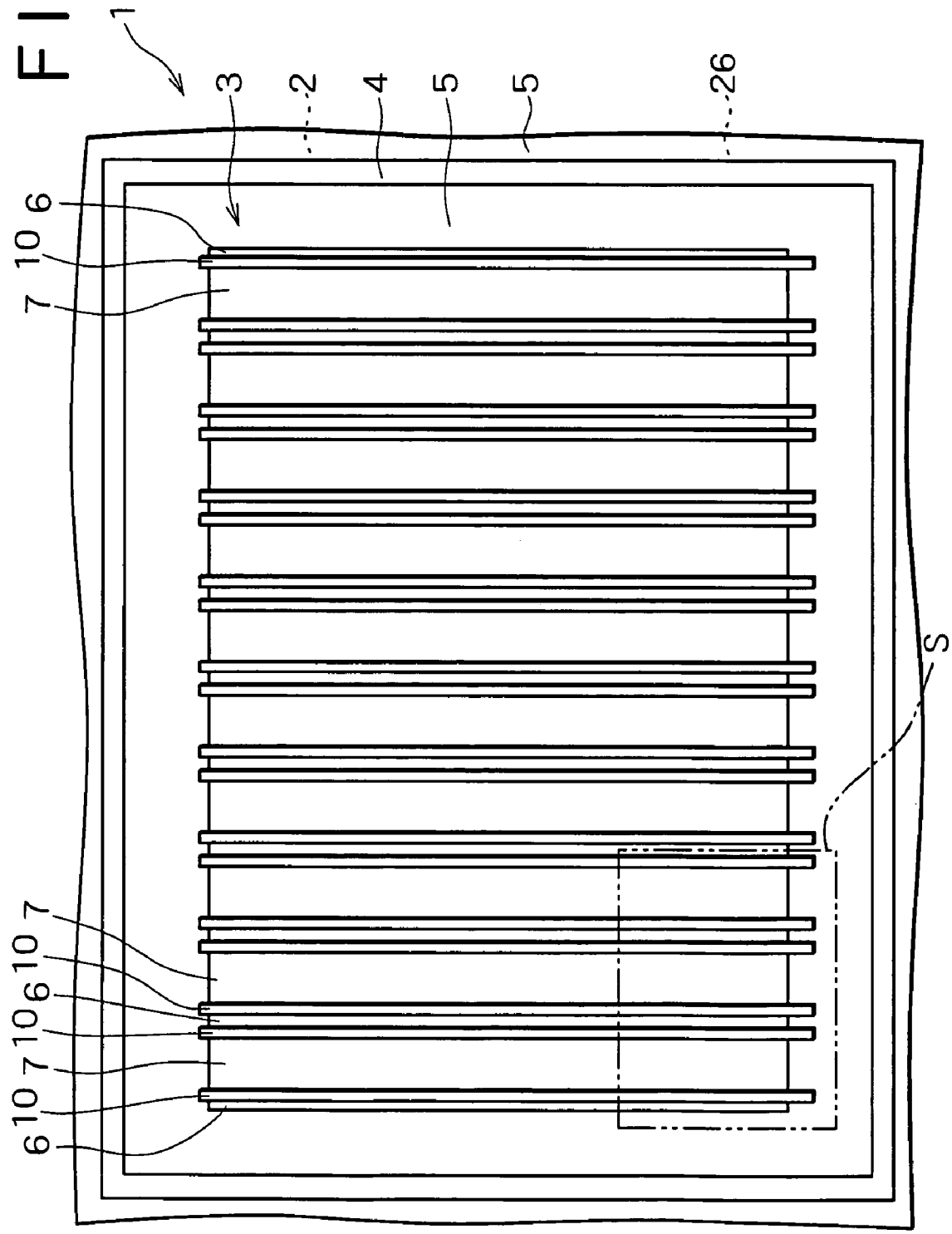
FIG. 6 is a plan view showing an ESD protecting-element in the semiconductor device according to the embodiment.
Figure 7:
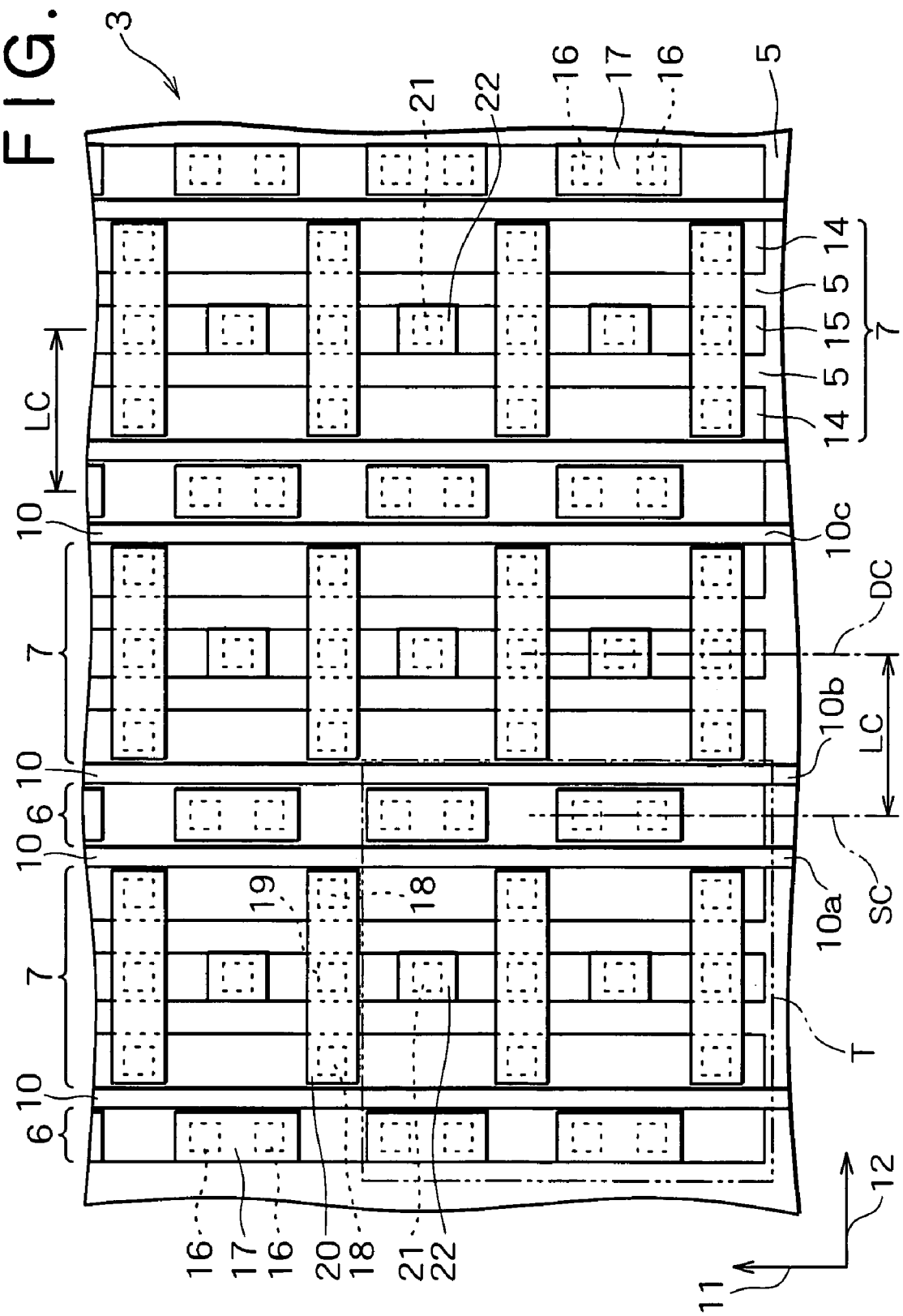
FIG. 7 is a plan view showing a part of the ESD protecting element shown in FIG. 6.
Figure 8:
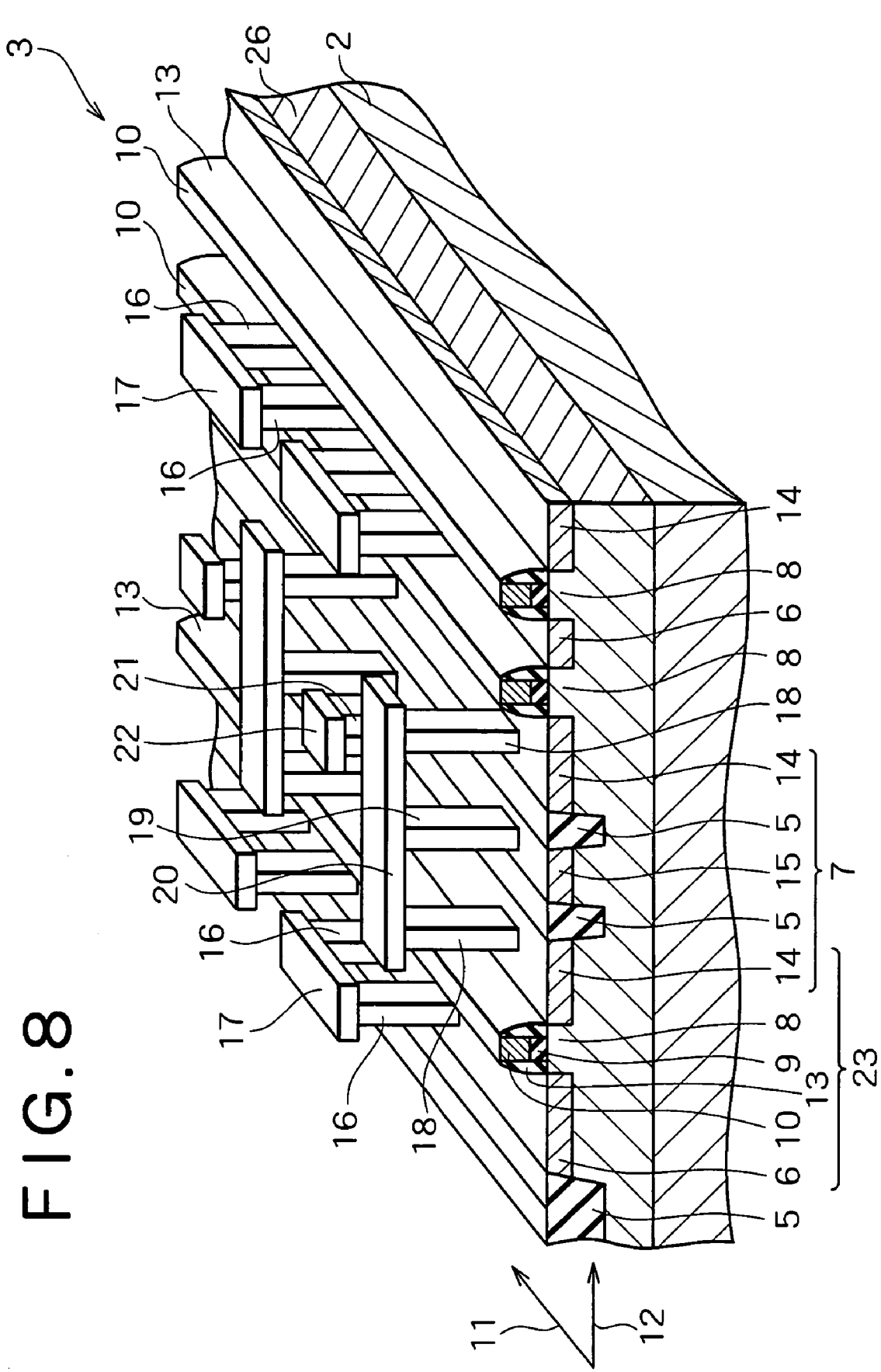
FIG. 8 is a perspective view showing a part of the ESD protecting element shown in FIG. 7.

Preferred embodiments of the present invention will be specifically described below with reference to the accompanying drawings. To begin with the first embodiment of the invention will be discussed. FIG. 4 is a plan view exemplarily illustrating the principle of the embodiment. FIG. 5 is a cross-sectional view showing a part of a semiconductor device according to the embodiment. FIG. 6 is a plan view showing an ESD protecting element in the semiconductor device according to the embodiment. FIG. 7 is a plan view showing a part of the ESD protecting element shown in FIG. 6. FIG. 8 is a perspective view showing a part of the ESD protecting element shown in FIG. 7. FIGS. 4 and 5 illustrate only the typical components of the semiconductor device of the embodiment with the other components omitted from the illustrations.

As shown in FIG. 4, the key point of the embodiment lies in that the semiconductor device, which has a first conductivity type region 301 formed at the top surface of a semiconductor substrate (not shown), a gate insulating layer (not shown) formed at the top surface of the first conductivity type region 301, a gate electrode 302 formed on the gate insulating layer, and a first second conductivity type region 303 and a second second conductivity type region 304 respectively formed at both sides of a region directly underlying the gate electrode 302 in the first conductivity type region 301, further has a third second conductivity type region 306, as a resistor, formed at a position insulated and isolated by the second second conductivity type region 304 and the insulating isolation layer 305 in the first conductivity type region 301, a first contact 307 and a second contact 308 provided on the third second conductivity type region 306, and a third contact 310 provided on the second second conductivity type region 304, the first contact 307 and the second contact 308 are located at positions apart from each other, the third second conductivity type region 306 is coupled to a pad (not shown) via the first contact 307, and is coupled to the second second conductivity type region 304 via the second contact 308, a wiring layer 309 and the third contact 310, and a reference potential is applied to the first second conductivity type region 303. The first conductivity type region 301 is, for example, a P well, the first second conductivity type region 303 is one of a source and a drain, e.g., the source, and the second second conductivity type region 304 is the other one of the source and the drain, e.g., the drain.

As FIG. 4 is a diagram illustrates a model of the features of the embodiment, only the center contact is shown and the other contacts are omitted. Although the description of the embodiment is given of a case where the first conductivity type region 301 is a P well, as is well known, a P type silicon substrate is generally used as the substrate of a semiconductor device.

As shown in FIGS. 5 and 6, the semiconductor device, 1 according to the embodiment is provided with a P type silicon substrate 2 (hereinafter simply called "silicon substrate 2" too) on the top surface of which a P well 26 and an N well (not shown) are formed apart from each other. The P well 26 and the N well are isolated from each other by an isolation layer 29. An ESD protecting element 3 is formed at the top surface of the P well 26. Another ESD protecting element (not shown) is formed at the top surface of the N well. Those ESD protecting elements use the parasitic bipolar operation of an MOS transistor.

The following will give a detailed discussion of the structure of the ESD protecting element 3 formed at the top surface of the P well 26, which is similar to the structure of another ESD protecting element formed at the top surface of the N well. It is to be noted however that the polarities of the individual portions of the latter ESD protecting element are opposite to the polarities of the corresponding portions of the ESD protecting element 3. As shown in FIGS. 5 and 6, a ring-like $p^+$ type diffusion region is formed at that region of the top surface of the silicon substrate 2 which surrounds the ESD protecting element 3, and serves as a guard ring 4. An STI (Shallow Trench Isolation) region 5 is formed at the other region of the top surface of the silicon substrate 2 than the ESD protecting element 3 and the guard ring 4. In the ESD protecting element 3, a plurality of source regions 6 and a plurality of ballast resistor regions 7 are formed, and are laid out alternately along one direction in such a way that both layout end portions are the source regions 6. The source regions 6 are $n^+$ type diffusion regions.

FIG. 7 shows a region S shown in FIG. 6, and FIG. 8 shows a region T shown in FIG. 7. As shown in FIGS. 7 and 8, a region between the source region 6 and the ballast resistor region 7 at the top surface of the P well 26 is a channel region 8. Provided on the channel region 8 is a gate insulating layer 9 on which a gate electrode 10 is provided. Therefore, a plurality of gate electrodes 10 extend in parallel to one another or extend approximately or substantially in parallel to one another. The direction in which the gate electrodes 10 extend is a widthwise direction 11 of the gate. The direction in which the gate electrodes 10 are laid out, i.e., the direction parallel to the top surface of the silicon substrate 2 and orthogonal to the widthwise direction 11 of the gate is a lengthwise direction 12 of the gate. Although side walls 13 are formed at both sides of the gate insulating layer 9 and the gate electrode 10, they are not shown in FIGS. 6 and 7.

Drain regions 14 or $n^+$ type diffusion regions are formed at those regions in the ballast resistor region 7 which are in contact with the associated channel regions 8. An $n^+$ type diffusion region 15 is provided at that region of the ballast resistor region 7 which lies between the drain regions 14. The $n^+$ type diffusion region 15 is a resistor. The STI region 5 is formed at a region between the drain region 14 and the $n^+$ type diffusion region 15. This allows the $n^+$ type diffusion region 15 to be insulated from the drain region 14 in the silicon substrate 2. A silicide layer 30 (see FIG. 9) is formed at the top surfaces of the source region 6, the ballast resistor region 7 and the gate electrode 10, excluding the top surface of the STI region 5. The silicide layer 30 is not shown in FIGS. 4 to 8.

A plurality of contacts 16 are provided on the source region 6. The contacts 16 are laid out in a column along the gates widthwise direction 11. The lower ends of the contacts 16 are connected to the source region 6. Every two of the contacts 16 make a pair. A metal wire 17 is provided above each pair of contacts 16 whose upper ends are connected to the metal wire 17. That is, two contacts 16 are connected to one metal wire 17. A single contact 18 is provided at that region on the drain region 14 which lies between the contacts 16. A plurality of contacts 19 are provided on the $n^+$ type diffusion region 15. Two contacts 18 provided on two different drain regions 14 and one contact 19 provided at the $n^+$ type diffusion region 15 are laid out in a column along the direction 12. A metal wire 20 is provided above the two contact 18 and the one contact 19. The upper ends of the two contact 18 and the one contact 19 are connected to the metal wire 20.

A single contact 21 is provided on the $n^+$ type diffusion region 15 between the contacts 19. A metal wire 22 is provided above the contact 21 whose upper end is connected to the bottom surface of the metal wire 22. Therefore, the contacts 21 and the contacts 19 are alternately laid out along the gate's widthwise direction 11. That is, the direction from the contact 21 to the contact 19 is the gate's widthwise direction 11. The contacts 16, 18, 19, and 21 are formed at the same layer, and are formed at the same time as the other contacts at the same layer in the semiconductor device are formed. The metal wires 17, 20, and 22 are formed at the same layer, and are formed at the same time as the other metal wires at the same layer in the semiconductor device are formed. An interlayer insulating layer (not shown) is provided on the silicon substrate 2. The contacts 16, 18, 19, and 21, and the metal wires 17, 20, and 22 are buried in the interlayer insulating layer.

The source region 6, the drain region 14, the channel region 8, the gate insulating layer 9, the gate electrode 10, and the side walls 13 constitute an NMOS transistor 23. The source region 6 is coupled to a ground-potential wire via the contacts 16 and the metal wire 17. The drain region 14 is coupled to a pad (not shown) via the contacts 18, the metal wire 20, the contact 19, the $n^+$ type diffusion region 15, the contact 21, and the metal wire 22. One NMOS transistor 23 is one finger. As a plurality of fingers are connected in parallel, the ESD protecting element 3 is constituted. That is, in the ESD protecting element 3, plural NMOS transistors 23 are laid out along the gate's lengthwise direction 12, and every adjoining two of the NMOS transistors 23 make a pair. The source region 6 is commonized in each pair of NMOS transistors 23. The metal wires 20 and 22, the $n^+$ type diffusion region 15, and the contacts 19 and 21 are commonized in each pair of adjoining NMOS transistors 23. The ESD protecting element 3 is connected in parallel to an internal circuit (not shown) which should be protected against ESD.

One example of the sizes of the individual portions of the ESD protecting element 3 will be given below. The semiconductor device 1 is designed by, for example, the 90 nm rule. The cross-sectional shape of each contact in parallel to the top surface of the silicon substrate 2 is a rectangle with, for example, a vertical length of 0.12 μm, a horizontal length of 0.12 μm or a circle with a diameter of, for example, 0.12 μm. The distance between the drain region 14 and the $n^+$ type diffusion region 15, for example, 0.14 μm, and the distance between the adjoining contact 19 and contact 21 is, for example, 0.20 μm. A comparative element length LC in the gate's lengthwise direction 12 is, for example, 1.0 to 1.5 μm; for example, the length LC is 1.14 μm. At this time, the contact resistance of each contact is, for example, 10 Ω.

The comparative element length LC is an index indicating the length of each finger in the gate's lengthwise direction 12, and is a concept provided for the purpose of comparing the required size of each finger of the conventional semiconductor device with the required size of each finger of the semiconductor device according to the embodiment of the invention. Therefore, the comparative element length LC can be said to be a substantial element length. As shown in FIG. 7, the comparative element length LC is defined as a distance between a center line SC of the source region 6 extending in the direction 11 and a center line DC of the ballast resistor region 7 extending in the direction 11. The center line SC of the source region 6 is the center line of the opposing end portions of the gate electrode 10 (gate electrodes 10*a* and 10*b*) on both sides of the source region 6. The center line DC of the ballast resistor region 7 is the center line of the opposing end portions of the gate electrode 10 (gate electrodes 10*b* and 10*c*) on both sides of the ballast resistor region 7.

Figure 9:
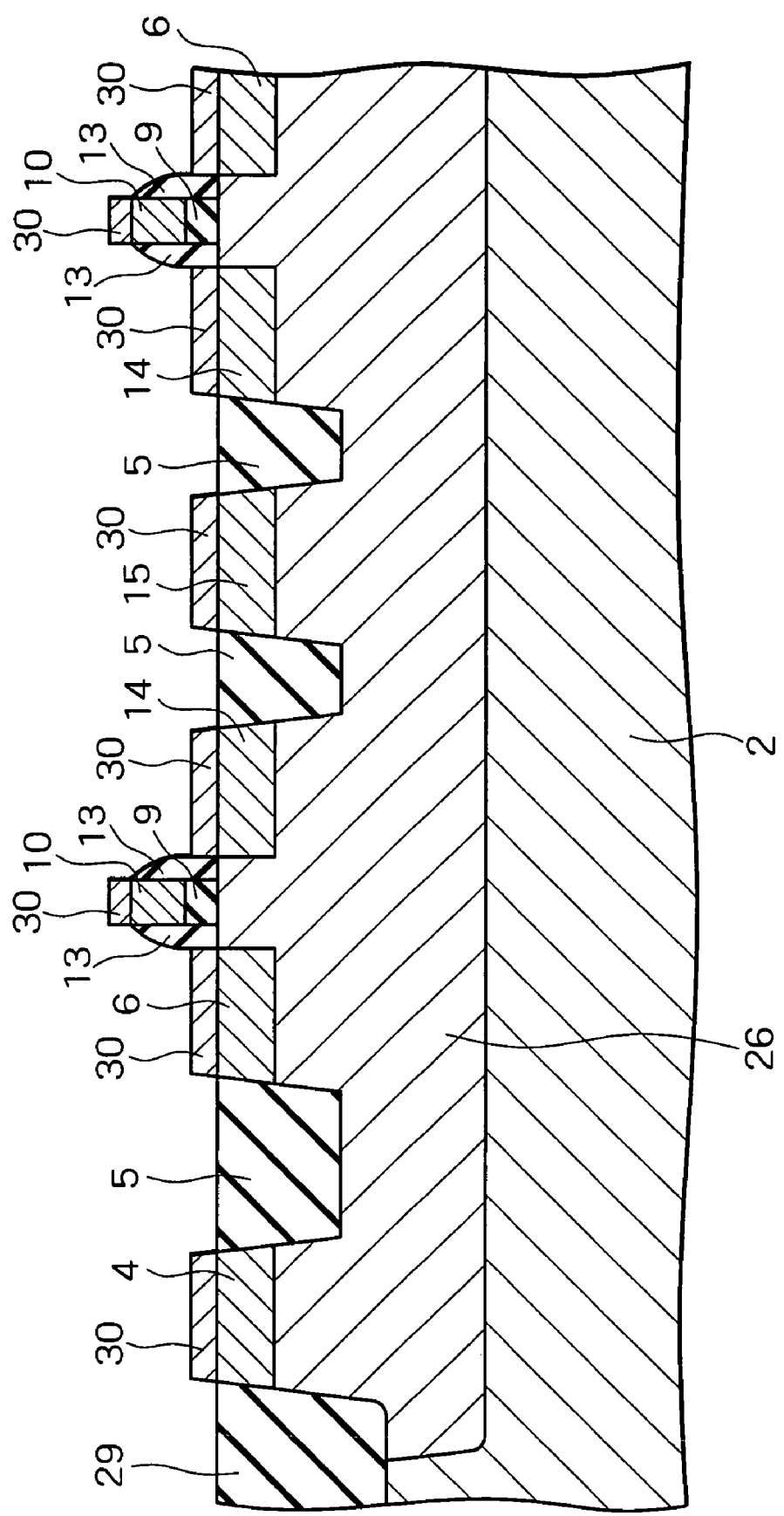
FIG. 9 is a cross-sectional view illustrating a method of fabricating the semiconductor device according to the embodiment.

A method of fabricating the semiconductor device according to the embodiment will be described next. FIG. 9 is a cross-sectional view illustrating the method of fabricating the semiconductor device according to the embodiment. As shown in FIGS. 4 to 9, first, the STI region 5 and the isolation layer 29 are formed at the top surface of the P type silicon substrate 2 in the same process by a known method. Next, the P well 26 and the N well (not shown) are formed at a predetermined location at the top surface of the silicon substrate 2. At this time, the P well 26 and the N well are formed in such a way as to be set apart from each other with the isolation layer 29 in between.

Although a method of forming the ESD protecting element 3 at the top surface of the P well 26 will be discussed below, the same is applied to a method of forming another ESD protecting element at the top surface of the N well. The gate insulating layer 9, the gate electrode 10 and the side walls 13 are formed at the top surface of the P well 26. Next, the source region 6, the drain region 14 and the $n^+$ type diffusion region 15 are formed at the top surface of the P well 26. At this time, the source region 6 and the drain region 14 are formed at the opposing positions with the directly underlying region of the gate electrode 10 in between. The directly underlying region of the gate electrode 10, i.e., the region between the source region 6 and the drain region 14, becomes the channel region 8. The $p^+$ type diffusion region is formed as the guard ring 4 at the top surface of the P well 26.

Next, the silicide layer 30 is formed the top surfaces of the source region 6, the drain region 14, the $n^+$ type diffusion region 15, the guard ring 4 and the gate electrode 10 by a known method as shown in FIG. 9. The thickness of the silicide layer 30 is set to, for example, 30 nm. Next, an interlayer insulating layer (not shown) comprised of a silicon nitride layer or a silicon oxide nitride layer or so is deposited on the entire surface to a thickness of 0.6 μm or so.

Next, contacts are formed at the silicon substrate 2. At this time, the contacts 16 are formed at the source region 6, the contact 18 is formed at the drain region 14, and the contacts 19 and 21 are formed at the $n^+$ type diffusion region 15. The contacts are formed by the following method. Columnar holes with a diameter of 0.12 μm or so are formed at predetermined positions of the interlayer insulating layer by a known method such as plasma etching. The depth of the holes is set to the depth to penetrate the interlayer insulating layer, e.g., 0.6 μm or so. A barrier metal comprised of a double-layer film (Ti/TiN) is deposited on the inner wall of each hole, and is connected to the silicide layer 30. Next, a conductive material such as W is buried in the holes, thereby forming contacts. The resistance of the contacts formed this way is about 20Ω, which includes the resistance of the barrier metal layer itself and the contact resistance of the barrier metal layer and the silicide layer in a ratio of about half and half.

Next, the metal wire 17 which connects the contacts 16 and the metal wire 20 which connects the contacts 18 and 19 together, and the metal wire 22 which connects the contact 21 to a pad (external terminal) are formed simultaneously. Those metal wires are formed of a material, such as aluminum or copper, by a known method. The process of forming the metal wires is carried out at the same time as other necessary metal wires, such as the metal wire which connects the contacts on another diffusion layer of the semiconductor device and the metal wire which connects the contacts formed on the gate electrode, are formed.

Next, an overlying interlayer insulating layer, an overlying wire, lead-out means of the pad, and the like are formed. Then follows a process which is normally needed, such as packaging, thereby completing the semiconductor device according to the embodiment.

Figure 10A:
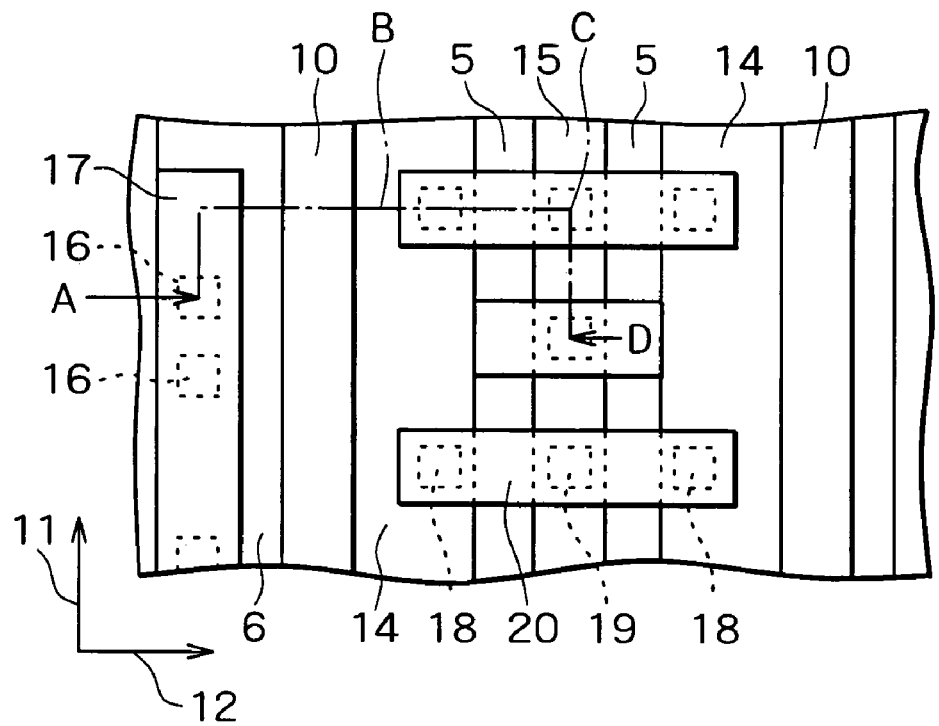
FIG. 10A is a plan view showing the operation of the semiconductor device according to the embodiment.
Figure 10B:
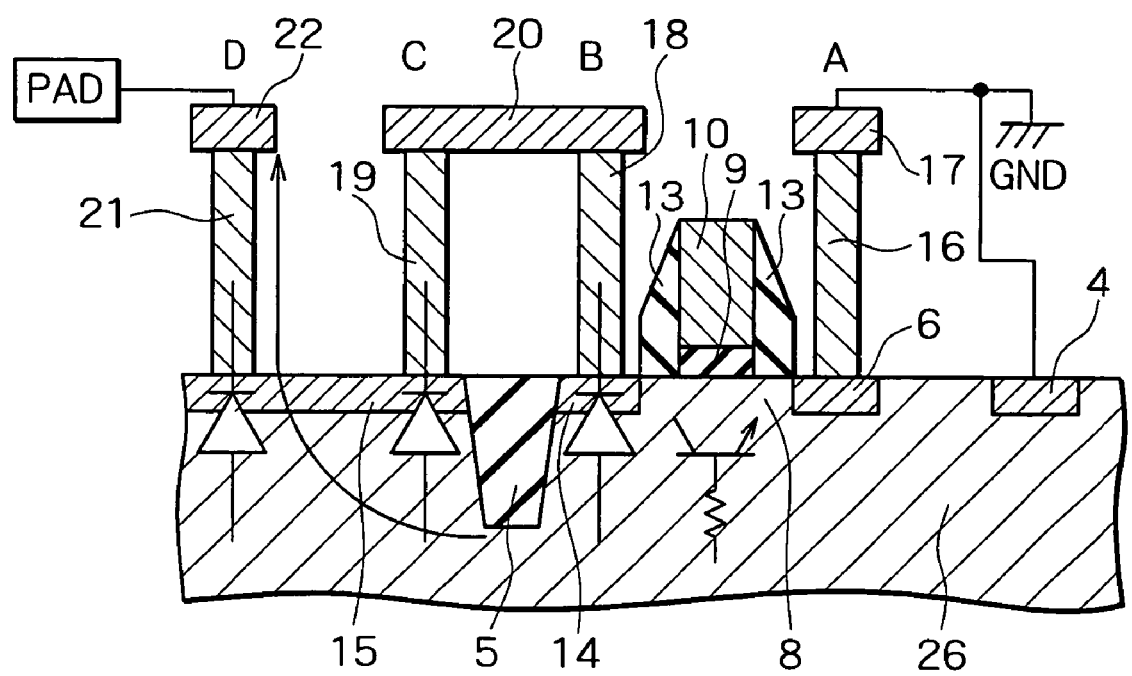
FIG. 10B is a cross-sectional view along line A-B-C-D in FIG. 10A.

Next, the operation of the semiconductor device according to the embodiment constructed in the above-described manner will be discussed. FIG. 10A is a plan view showing the operation of the semiconductor device according to the embodiment, and FIG. 10B is a cross-sectional view along line A-B-C-D in FIG. 10A. As shown in FIGS. 10A and 10B, pn junction is formed between the P well 26 and the source region 6 which is an n+ type diffusion region, the drain region 14 and the n+ type diffusion region 15.

The following will discuss the operation in case where the ground potential is applied as a reference potential to the metal wire 17, and a positive ESD current is supplied to the pad with the metal wire 22 connected to the pad. The positive ESD current input from the pad flows into the drain region 14 through the current path of the metal wire 22—contact 21—n+ type diffusion region 15—contact 19—metal wire 20—contact 18. At this time, the current path in the n+ type diffusion region 15 extends from the contact 21 toward the contact 19 in the gate's widthwise direction 11. Therefore, the current path includes three contacts 21, 19 and 18 and the n+ type diffusion region 15, and the resistances of the individual elements are connected in series. The contact resistance per contact is, for example, 20 Ω or so, and the diffusion layer resistance of the n+ type diffusion region 15 is, for example, 10 Ω or so. The total resistance of the current path therefore becomes 7 Ω or so, for example. If ten sets of such current paths are connected in parallel to the drain region 14 of one finger, the total resistance or the ballast resistance to be added to one finger becomes, for example, 0.70Ω or so. When twenty fingers are connected in parallel, the ballast resistance in the entire ESD protecting element becomes, for example, 0.35Ω or so.

When the voltage to be applied to the drain region 14 exceeds a predetermined threshold, the NMOS transistor 23 snaps back and the parasitic bipolar transistor formed under the NMOS transistor 23 operates, causing the current to flow to the ground-potential wire via the drain region 14—channel region 8—source region 6—contact 16—metal wire 17. This allows the ESD current supplied to the pad to be discharged to the ground-potential wire, thereby protecting the internal circuit against the ESD current.

Next, the operation in case where a negative ESD current is supplied will be described. In this case, the current flows into the pad through the current path of the silicon substrate 2 (P well 26)—n+ type diffusion region 15—contact 21—metal wire 22. This allows the negative ESD current supplied to the pad to be discharged, thereby protecting the internal circuit against the ESD current. At this time, the current path includes only one contact 21 and the distance in the n+ type diffusion region 15 over which the current flows is small, so that the ballast resistance becomes significantly lower as compared with the case where the positive ESD current is input.

When the positive ESD current is supplied to the pad, the current path of the ESD current includes three contacts 21, 19 and 18 in the embodiment. This makes it possible to use the contact resistances of those contacts as a ballast resistance. This makes it possible to design the ESD protecting element smaller while securing the required ballast resistance. For example, the comparative element length of the conventional ESD protecting element is 3 to 4 μm, whereas the comparative element length according to the embodiment can be set to, for example, 1.14 μm.

Figure 11A:
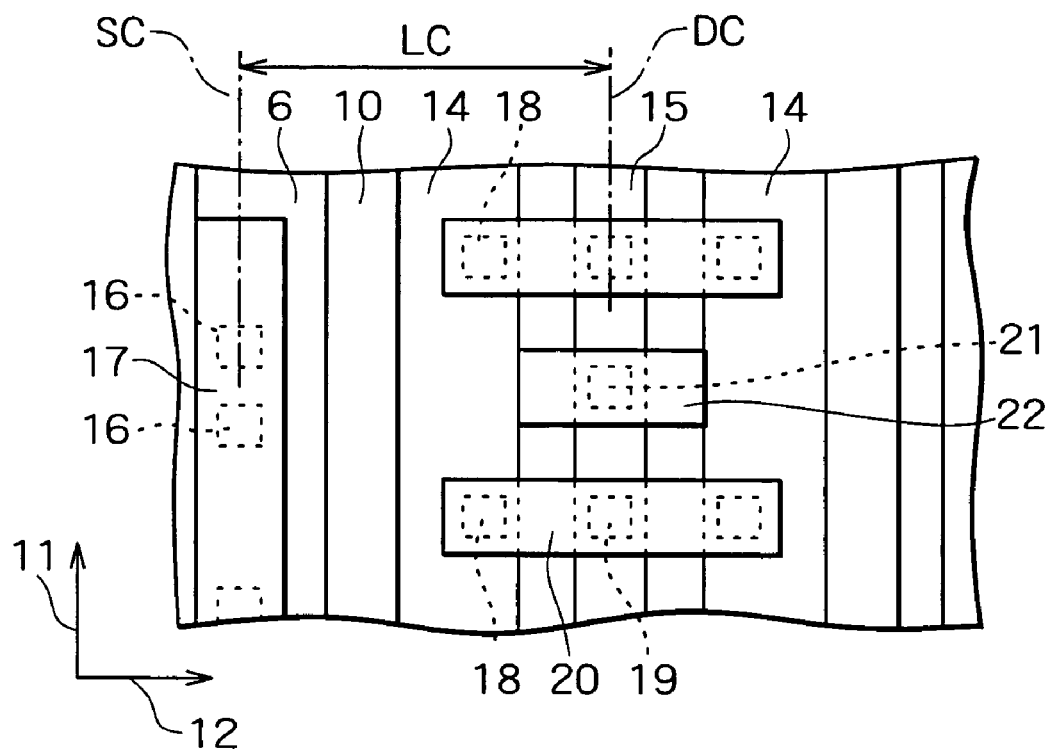
Figure 11B:
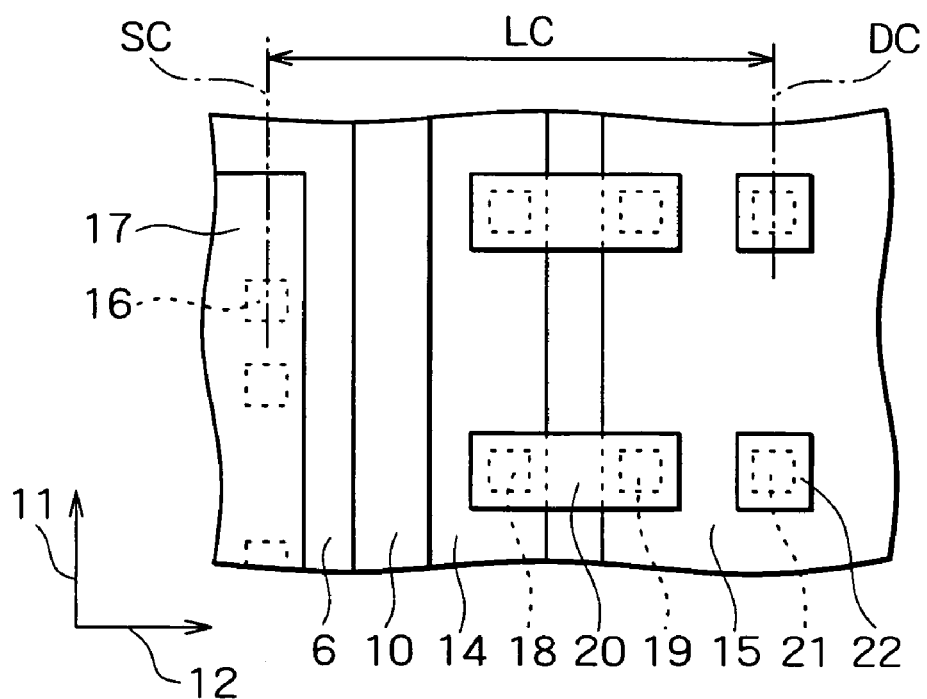

FIGS. 11A and 11B are plan views for explaining the effect of the embodiment. FIG. 11A shows an ESD protecting element where the current path in the n+ type diffusion region is formed in the widthwise direction of the gate, and FIG. 11B shows an ESD protecting element where the current path in the n+ type diffusion region is formed in the lengthwise direction of the gate. As shown in FIG. 11A, the contacts 19 and the contact 21 are laid out on the n+ type diffusion region 15 along the gate's widthwise direction 11 according to the embodiment, so that the current path in the n+ type diffusion region 15 can be formed in parallel to the gate's widthwise direction 11. It is therefore possible to form the current path with a sufficient length while making the comparative element length LC smaller. If the contacts 19 and the contact 21 are laid out on the n+ type diffusion region 15 along the gate's lengthwise direction 12 as shown in FIG. 11B, the comparative element length LC should be set large to secure the required current path. According to the embodiment, as apparent from the above, the layout of the contacts 19 and the contact 21 along the gate's widthwise direction 11 can make the area of the ESD protecting element 3 smaller. This makes it possible to reduce the area of the I/O block by 50 to 70% or so as compared with the conventional semiconductor device. This can contribute to making the semiconductor device 1 smaller.

When a negative ESD current is supplied to the pad, only a slight ballast resistance is added according to the embodiment. Further, making the comparative element length shorter can further reduce the resistance of the current path. As a result, a sufficient protecting performance can be attained even when a negative ESD current is supplied to the pad.

In addition, reducing the comparative element length can make the distance between fingers shorter, so that adjoining fingers can be made closer to each other. This enhances the substrate coupling effect, so that one finger snaps back, another finger located close to that finger is likely to snap back. This can suppress the concentration of the current to the first finger that has snapped back more effectively, and can thus prevent the fingers from being damaged.

Figure 12:
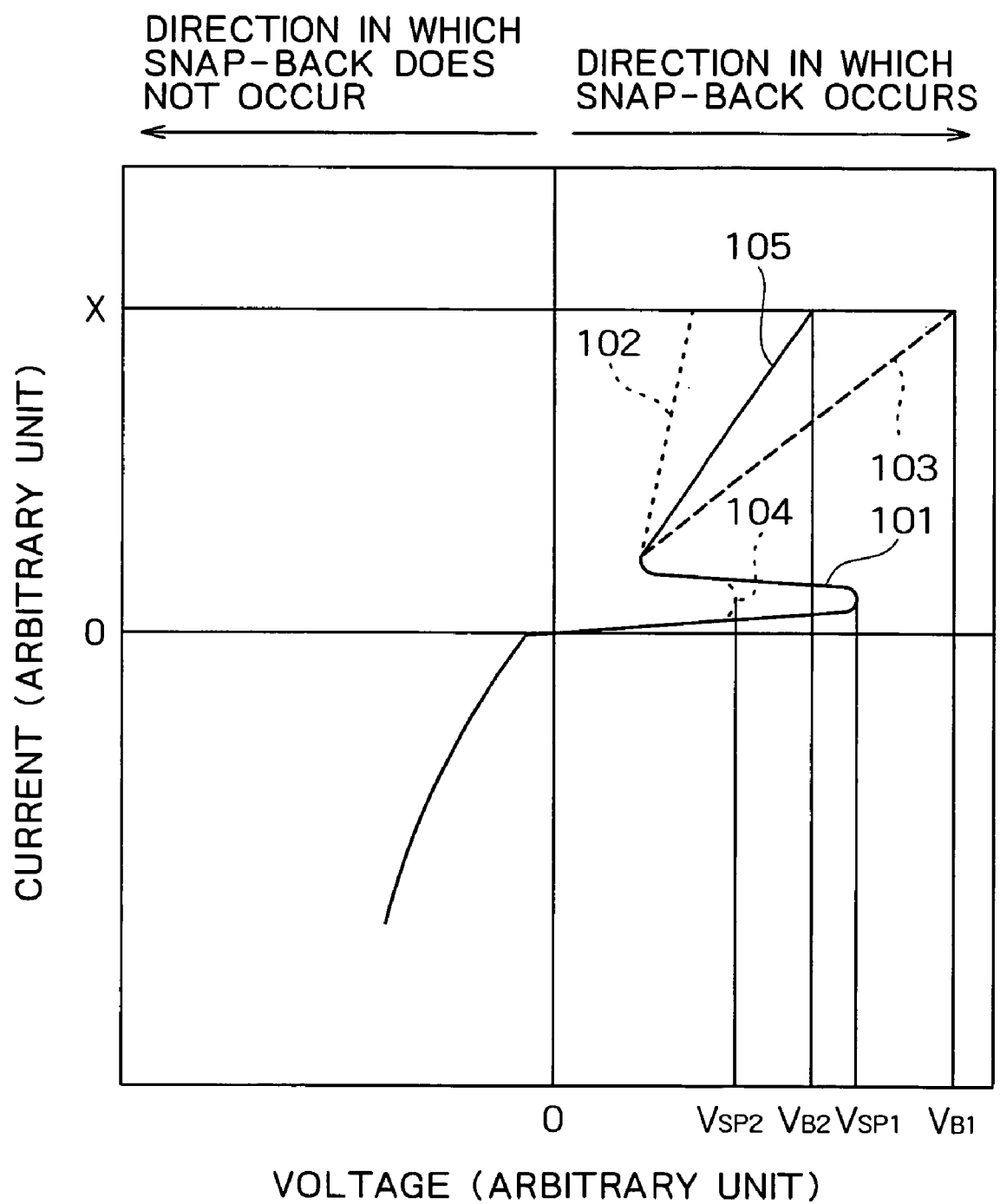
FIG. 12 is an exemplary diagram for explaining a substrate coupling effect with a voltage to be applied to the ESD protecting element taken on the horizontal axis and a current flowing through the ESD protecting element taken on the vertical axis.

FIG. 12 is an exemplary diagram for explaining the substrate coupling effect with a voltage to be applied to the ESD protecting element taken on the horizontal axis and a current flowing through the ESD protecting element taken on the vertical axis. As discussed in the DESCRIPTION OF THE RELATED ART, normally, that transistor (finger) in plural NMOS transistors 23 constituting the ESD protecting element 3 which is located in the center snaps back first, then other fingers snap back sequentially. At this time, as the individual fingers are actually located close to one another, the parasitic bipolar transistor operates to bring about the substrate coupling effect, so that the threshold voltage for the second and subsequent fingers which will snap back drops.

That is, when one finger snaps back and the current flows into this finger, as indicated by a solid line 101 in FIG. 12, the substrate potential near the finger rises. As a result, the base potential near the first finger that has snapped back rises. Accordingly, another finger positioned near the first finger that has snapped back snaps back at a voltage $V_{SP2}$ lower than the snap-back start voltage $V_{SP1}$ of the first finger that has snapped back, as indicated by a broken line 104. Therefore, a ballast resistor whose resistance is low enough for a breakdown voltage $V_{B2}$ to exceed the snap-back voltage $V_{SP2}$ should be added to each finger, as indicated by a solid line 105.

The rise in base potential is greater for a finger which is located closer to the first finger that has snapped back, so that the closer to one another the plural fingers constituting the ESD protecting element 3 are located, the greater the snap-back voltage $V_{SP2}$ drops. Consequently, the protection performance against ESD can be secured even with a relatively low ballast resistance. An extra resistance to be added in the normal circuit operation can be lower, and the performance in the normal circuit operation can be improved accordingly.

In the embodiment, the contacts 16, 18, 19 and 21 can be formed simultaneously as those contacts at other portions in the semiconductor device are formed. The metal wires 17, 20 and 22 can be formed simultaneously as those metal wires at other portions in the semiconductor device are formed. This eliminates the need for provision of a special step in forming the ESD protecting element according to the embodiment. Therefore, the manufacturing cost for the ESD protecting element does not increase significantly.

Although the foregoing description of the embodiment has been given of the case where multiple (e.g., 20) gate electrodes are all connected in parallel to one another, all the gate electrodes should not necessarily be connected in parallel to one another according to the invention. For example, a plurality of gate electrodes which belong to one group may be connected in parallel to one another while a plurality of gate electrodes which belong to another group are connected in parallel to one another. In this case, the gate electrodes which belong to one group and the gate electrodes which belong to another group can be designed in such a way that the groups are electrically independent of each other. In this case, the number of groups of gate electrodes may be two or greater.

Figure 13:
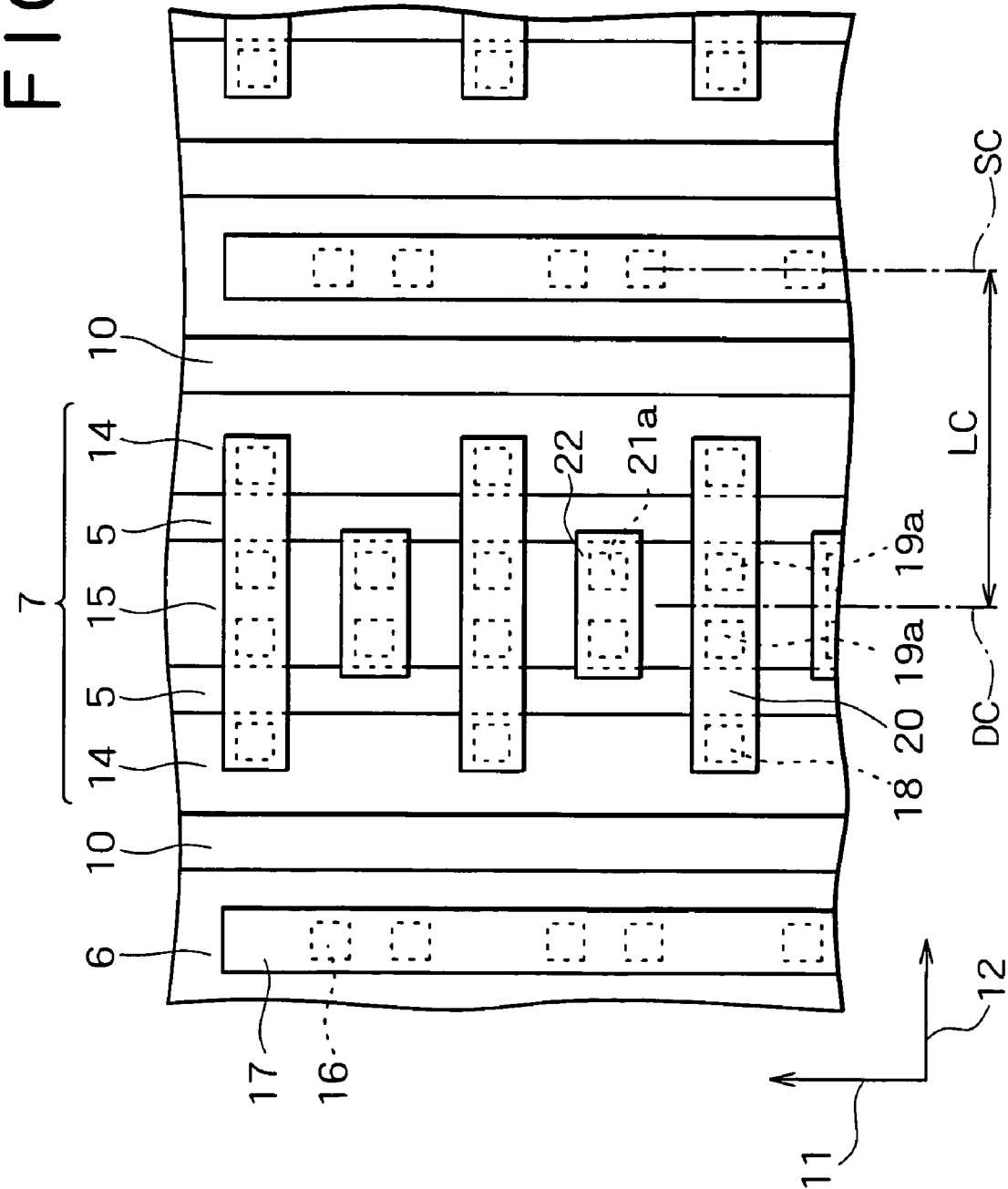
FIG. 13 is a plan view showing an ESD protecting element according to a second embodiment of the invention.

The second embodiment of the invention will be described next. FIG. 13 is a plan view showing an ESD protecting element according to the embodiment. As shown in FIG. 13, the embodiment differs from the first embodiment in the following points. In the second embodiment, the widths of the $n^+$ type diffusion region 15, the metal wires 20 and 22 or the lengths in the gate's lengthwise direction 12 are greater. Two contacts 19a laid out along the gate's widthwise direction are provided in place of the contact 19 in the first embodiment. Further, two contacts 21a laid out along the gate's widthwise direction are provided in place of the contact 21 in the first embodiment. The contacts 21a which make a pair are connected together by the metal wire 22.

Accordingly, the comparative element length LC is slightly longer than that in the first embodiment, and becomes, for example, 1.22 µm. In the embodiment, the contact resistance of the contact 16 is, for example, 20Ω, the total contact resistance of the two contacts 19a is, for example, 10Ω the total contact resistance of the two contacts 21a is, for example, 10Ω, the sheet resistance of the $n^+$ type diffusion region 15 is, for example, 5Ω, and those resistances are connected in series. When a positive ESD current is applied to the pad, therefore, the resistance of the current path formed between the pad and the ground-potential wire becomes, for example, 45Ω. The other structure of the embodiment is the same as that of the first embodiment.

In the first embodiment and the second embodiment, the $n^+$ type diffusion region 15 is connected to the two drain regions 14 located on both sides of the region 15. In the first embodiment, therefore, currents twice as large as the currents flowing in the respective contacts 16 and 18 flow in the contacts 19 and 21, respectively. As a result, when the ESD current is large, the contacts 19 and 21 are easier to break. In the second embodiment, by way of comparison, the two contacts 19a are provided in parallel to the respective current path and the two contacts 21a are provided in parallel to the respective current path. Therefore, the currents flowing in the contacts 19a and 21a become equal in size to the currents flowing in the contacts 16 and 18. Accordingly, the current concentration onto the contacts 19a and 21a does not occur, thereby improving the ESD durability. The other operation and effects of the embodiment are the same as those of the first embodiment.

Figure 14:
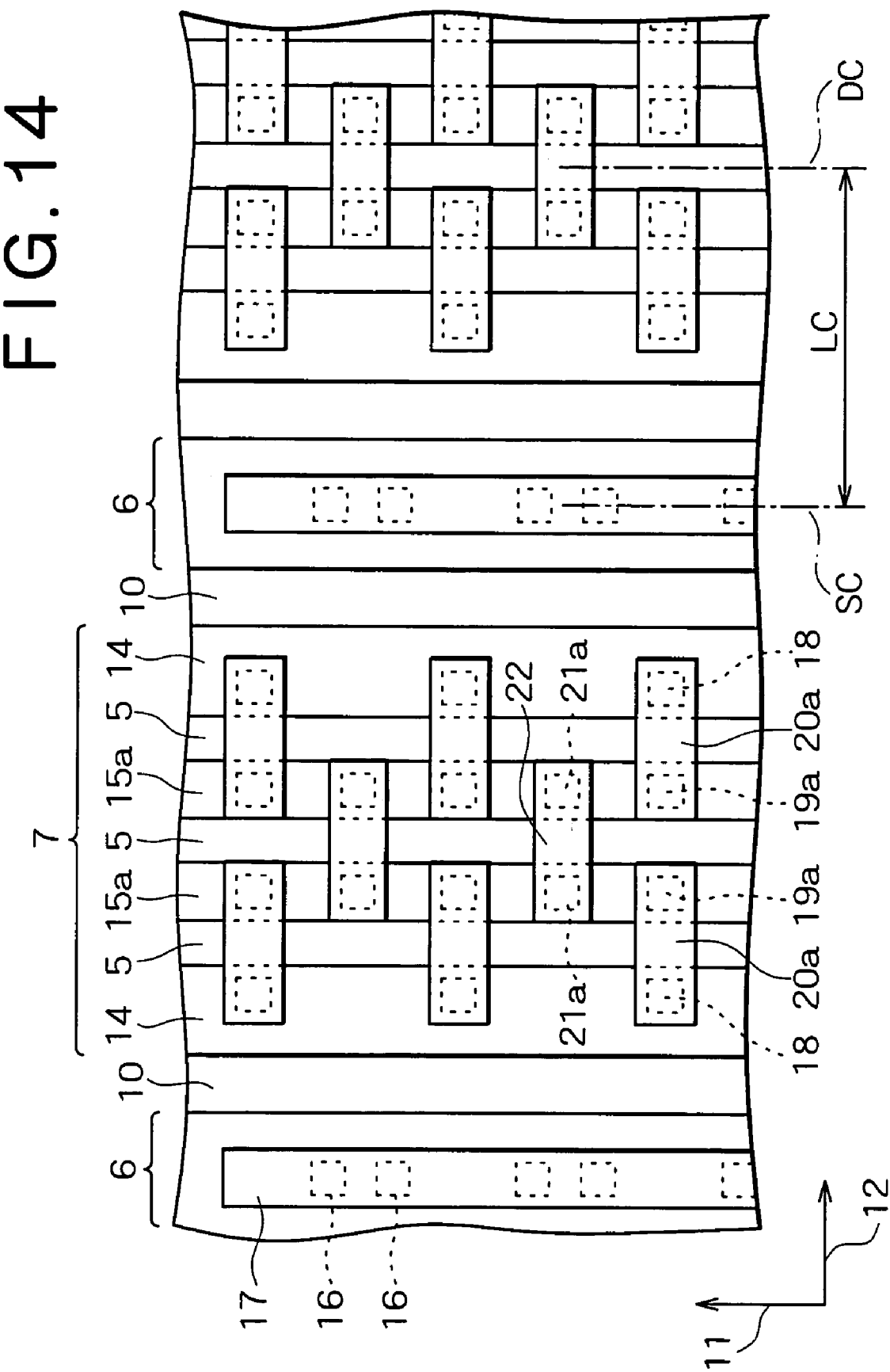
FIG. 14 is a plan view showing an ESD protecting element according to a third embodiment of the invention.

The third embodiment of the invention will be described next. FIG. 14 is a plan view showing an ESD protecting element according to the embodiment. As shown in FIG. 14, the embodiment differs from the second embodiment in the following points. In the third embodiment, the $n^+$ type diffusion region 15 is separated into two $n^+$ type diffusion regions 15a in the direction 12. The STI region 5 is formed between the $n^+$ type diffusion regions 15a. Two contacts 19a which make a pair are provided one on each $n^+$ type diffusion region 15a. Two contacts 21a which make a pair are provided one on each $n^+$ type diffusion region 15a. Accordingly, the metal wire 20 is separated into two metal wires 20a in the direction 12. Each contact 19a and one contact 18 adjacent to that contact 19a are connected to each metal wire 20a.

Accordingly, the comparative element length LC is slightly longer than that in the second embodiment, and becomes, for example, 1.34 µm. In the embodiment, the contact resistance of the contact 18 is, for example, 20Ω, the contact resistance of the contact 19a is, for example, 20Ω, the contact resistance of the contact 21a is, for example, 20Ω, the sheet resistance of the $n^+$ type diffusion region 15 is, for example, 10Ω, and those resistances are connected in series. When a positive ESD current is applied to the pad, therefore, the resistance of the current path formed between the pad and the ground-potential wire becomes, for example, 70Ω. The other structure of the embodiment is the same as that of the first embodiment.

In the third embodiment, the currents flowing in the contacts 19a and 21a become equal in size to the currents flowing in the contacts 16 and 18, so that the ESD durability is improved. The embodiment can improve the ballast resistance while keeping the ESD durability about the same as that of the second embodiment. The other operation and effects of the embodiment are the same as those of the first embodiment.

Figure 15:
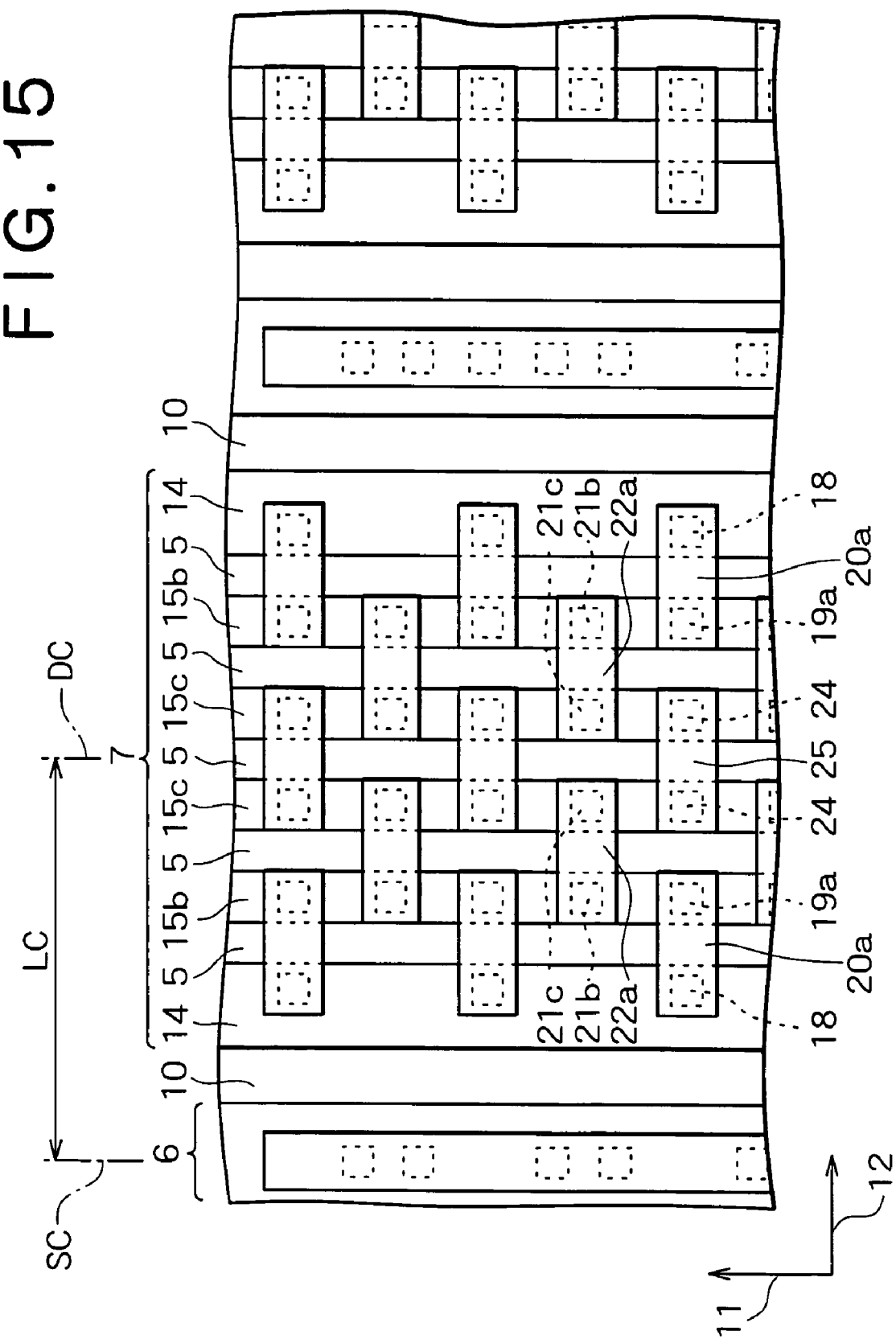
FIG. 15 is a plan view showing an ESD protecting element according to a fourth embodiment of the invention.

The fourth embodiment of the invention will be described next. FIG. 15 is a plan view showing an ESD protecting element according to the embodiment. As shown in FIG. 15, in the embodiment, the $n^+$ type diffusion region 15 is separated into four $n^+$ type diffusion regions, two $n^+$ type diffusion regions 15b and two $n^+$ type diffusion regions 15c, in the direction 12 in the ballast resistor region 7. In each ballast resistor region 7, the $n^+$ type diffusion regions 15b and 15c are laid out in the order of the $n^+$ type diffusion region 15b, the $n^+$ type diffusion region 15c, the $n^+$ type diffusion region 15c and the $n^+$ type diffusion region 15b. The STI region 5 is formed between the $n^+$ type diffusion regions 15b and 15c. The metal wire 20 is separated into two metal wires 20a in the direction 12, and the metal wire 22 is separated into two metal wires 22a in the direction 12, with a wire 25 provided between the metal wires 20a.

The contact 19a is provided at the $n^+$ type diffusion region 15b at a position corresponding to the contact 18. The lower end of the contact 18 is in contact with the drain region 14, and the upper end is in contact with the metal wire 20a. The upper end of the contact 19a is in contact with the metal wire 20a, and the lower end is in contact with the $n^+$ type diffusion region 15b. Accordingly, the drain region 14 is coupled to the $n^+$ type diffusion region 15b via the contact 18, the metal wire 20a and the contact 19a.

A contact 21b is provided at the $n^+$ type diffusion region 15b between the contacts 19a. A contact 21c is provided at the $n^+$ type diffusion region 15c at a position corresponding to the contact 21b. The lower end of the contact 21b is in contact with the n⁺ type diffusion region 15b, and the upper end is in contact with the metal wire 22a. The upper end of the contact 21c is in contact with the metal wire 22a, and the lower end is in contact with the n⁺ type diffusion region 15c. Accordingly, the n⁺ type diffusion region 15b is coupled to the n⁺ type diffusion region 15c via the contact 21b, the metal wire 22a and the contact 21c.

A contact 24 is provided at the n⁺ type diffusion regions 15c between the contacts 21c, i.e., at a position corresponding to the contacts 18 and 19a. The two contacts 24 formed at the two n⁺ type diffusion regions 15c make a pair above which a metal wire 25 is laid out. The lower end of the contact 24 is in contact with the n⁺ type diffusion region 15c, and the upper end is in contact with the metal wire 25. The upper end of the contact 21c is in contact with the metal wire 22a, and the lower end is in contact with the n⁺ type diffusion region 15c. Accordingly, the two contacts 24 which make a pair are connected together by the metal wire 25, which is coupled to a pad.

In the embodiment, the comparative element length LC is slightly longer than those in the first to third embodiments, and becomes, for example, 1.75 μm. The positive ESD current supplied to the pad flows into the drain region 14 through the current path of the metal wire 25—contact 24—n⁺ type diffusion region 15c—contact 21c—metal wire 22a—contact 21b—n⁺ type diffusion region 15b—contact 19a—metal wire 20a—contact 18. That is, five contacts and two n⁺ type diffusion regions are intervened in the current path. The current paths in the n⁺ type diffusion regions 15b and 15c extend in the gate's widthwise direction 11. The contact resistance of each contact is, for example, 20Ω, and the diffusion layer resistance of each n⁺ type diffusion region is, for example, 10Ω, so that the resistance of the current path or the ballast resistance becomes, for example, 120Ω. The other structure of the embodiment is the same as that of the first embodiment.

In the fourth embodiment, five contacts and two n³⁰ type diffusion regions are intervened in the current path when a positive ESD current is supplied to the pad. Accordingly, the ballast resistance can be made higher than that in the first embodiment. As the currents flowing in the individual contacts are equal to one another, current concentration onto a specific contact is suppressed and the ESD durability is high. The other operation and effects of the embodiment are the same as those of the first embodiment.

Although the foregoing description of the first to fourth embodiments has been given of the case where three or five contacts are intervened in the current path to form a ballast resistor, the invention is not limited to this case and seven or more contacts may be intervened. Although the foregoing description of the first to fourth embodiments has been given of the case where an NMOS transistor is used as an ESD protecting element, the invention is not limited to this case and a PMOS transistor may be used instead. In this case, the ballast resistor is added to the drain and a supply potential is applied to the source region. Although the foregoing description of the first to fourth embodiments has been given of the case where the ballast resistor is added to the drain of an NMOS transistor, the ballast resistor ma be added to the source. In this case, instead of the source the drain can be made a common region between a pair of fingers.

Figure 16:
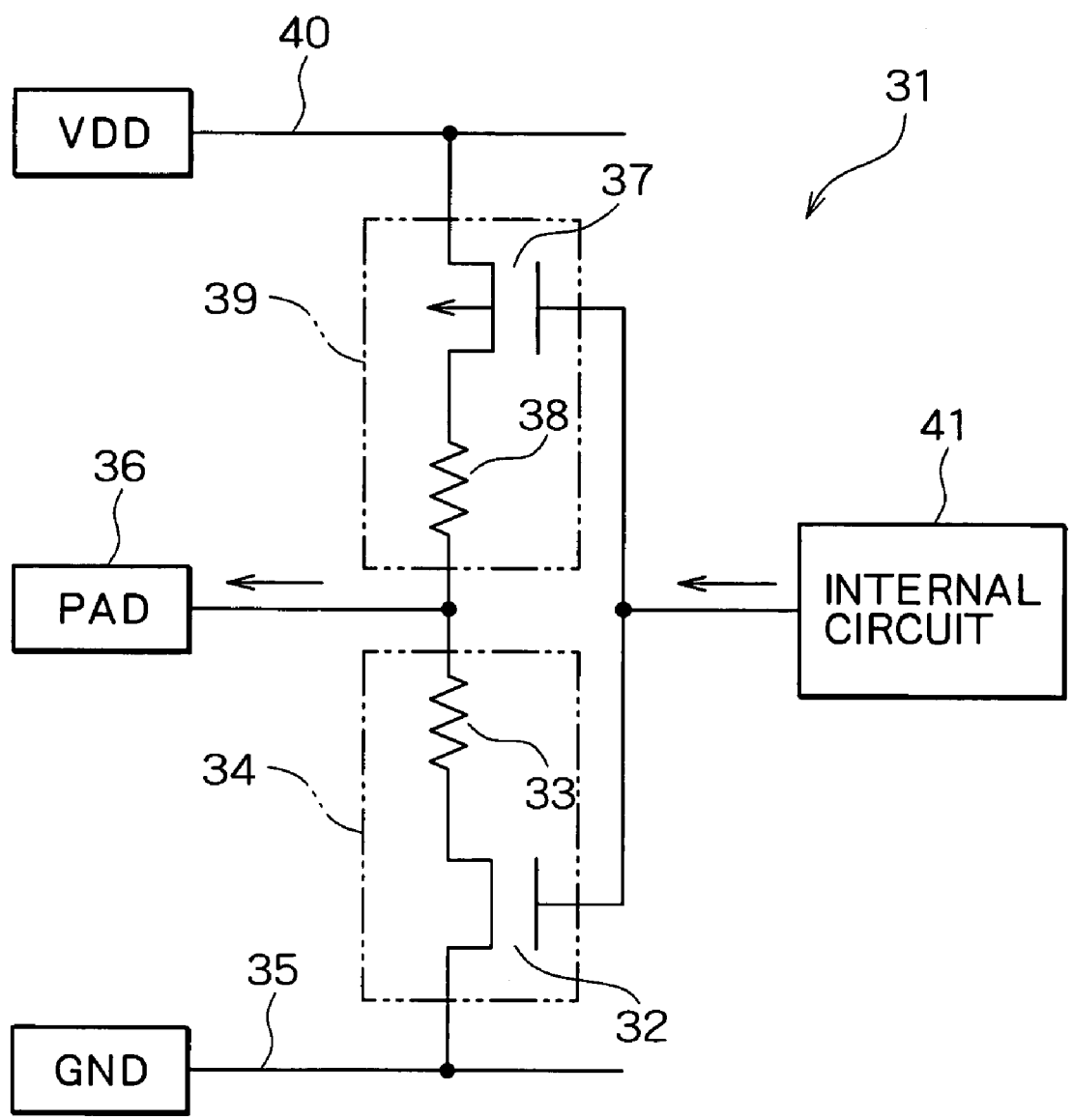
FIG. 16 is a circuit diagram illustrating a semiconductor device according to a fifth embodiment of the invention.

The fifth embodiment of the invention will be described next. FIG. 16 is a circuit diagram illustrating a semiconductor device according to the fifth embodiment. As shown in FIG. 16, the semiconductor device according to the embodiment is provided with an ESD protecting element which also serves as the output buffer of an internal circuit. That is, the semiconductor device, 31, is provided with ESD protecting elements 34 and 39.

The ESD protecting element 34 is provided with an NMOS transistor 32 and a ballast resistor 33. The ballast resistor 33 is connected to the drain of the NMOS transistor 32. The source of the NMOS transistor 32 is connected to a ground-potential wire 35, and the drain of the transistor 32 is connected to an output pad 36. The layout of the ESD protecting element 34 is the same as the ESD protecting element in any of the first to fourth embodiments.

The ESD protecting element 39 is provided with a PMOS transistor 37 and a ballast resistor 38. The ballast resistor 38 is connected to the drain of the PMOS transistor 37. The source of the PMOS transistor 37 is connected to a supply-potential wire 40, and the drain of the transistor 37 is connected to the output pad 36. The layout of the ESD protecting element 39 is the same as the ESD protecting element in any of the first to fourth embodiments.

The semiconductor device 31 is further provided with an internal circuit 41 whose output signal is supplied to the gate of the NMOS transistor 32 and the gate of the PMOS transistor 37. In other words, as the ESD protecting element is provided with a plurality of gates, the same output signal is supplied to the gates in the first to fourth embodiments. Although only a single internal circuit is shown in FIG. 16, the structure may be modified so that output signals are supplied to the gates from a plurality of internal circuits. In this case, output signals can be supplied to the gates separately; for example, the output signal output from the internal circuit 41 is supplied to fifteen gates while the output signals output from other internal circuits (not shown) are supplied to the other five gates. It is needless to say that when a plurality of signal outputs are supplied to a plurality of gates in as described above, the gate electrodes should be made electrically independent of one another. Further, some of the gate electrodes can be fixed to the ground potential or the supply potential without being supplied with any output signal.

The operation of the semiconductor device according to the embodiment with the above-described structure will be discussed below. When a high-level signal is output from the internal circuit 41, the NMOS transistor 32 is turned off and the PMOS transistor 37 is turned on, so that a high-level signal is output from the output pad 36. When a low-level signal is output from the internal circuit 41, however, the NMOS transistor 32 is turned on and the PMOS transistor 37 is turned off, so that a low-level signal is output from the output pad 36.

When the ESD current is input to the output pad 36, the ESD current flows through the ESD protecting element 34 and the ESD protecting element 39 and is discharged to the ground-potential wire 35 and the supply-potential wire 40. Accordingly, the internal circuit 41 can be protected against the ESD current. The other operation and effects of the embodiment are the same as those of the first embodiment.

Figure 17:
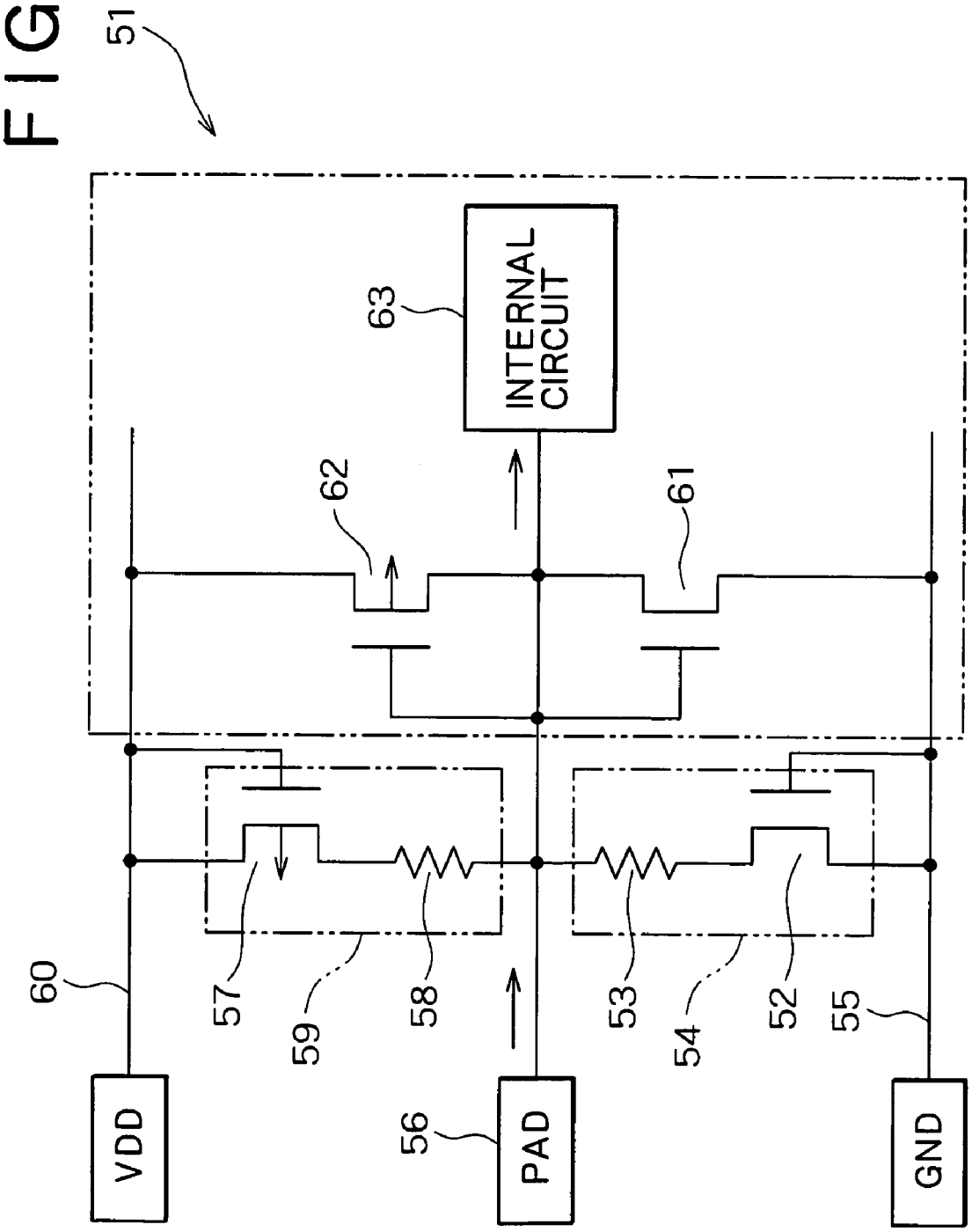
FIG. 17 is a circuit diagram illustrating a semiconductor device according to a sixth embodiment of the invention.

The sixth embodiment of the invention will be described next. FIG. 17 is a circuit diagram illustrating a semiconductor device according to the sixth embodiment. The circuit shown in FIG. 17 is intended to protect the input circuit against ESD. As shown in FIG. 17, the semiconductor device, 51, is provided with an ESD protecting element 54 and an ESD protecting element 59.

The ESD protecting element 54 is provided with an NMOS transistor 52 and a ballast resistor 53. The ballast resistor 53 is connected to the drain of the NMOS transistor 52. The source and gate of the NMOS transistor 52 are connected to a ground-potential wire 55, and the drain of the transistor 52 is connected to an input pad 56. The layout of the ESD protecting element 54 is the same as the ESD protecting element in any of the first to fourth embodiments. The gate of the NMOS transistor 52 may be connected to the ground-potential wire 55 directly or via a resistor or a transistor. When the gate of the NMOS transistor 52 is coupled to the ground-potential wire 55 via a resistor or a transistor, the snap-back start voltage of the ESD protecting element 54 can be made lower.

The ESD protecting element 59 is provided with a PMOS transistor 57 and a ballast resistor 58. The ballast resistor 58 is connected to the drain of the PMOS transistor 57. The source and gate of the PMOS transistor 57 are connected to a supply-potential wire 60, and the drain of the transistor 57 is connected to the input pad 56. The layout of the ESD protecting element 59 is the same as the ESD protecting element in any of the first to fourth embodiments.

The semiconductor device 51 is further provided with an NMOS transistor 61 and a PMOS transistor 62, which are a part of the internal circuit. The gate of the NMOS transistor 61 is connected to the input pad 56 and the source is connected to the ground-potential wire 55. The gate of the PMOS transistor 62 is connected to the input pad 56 and the source is connected to the supply-potential wire 60. The semiconductor device 51 is further provided with another internal circuit 63 whose input terminal is connected to the drain of the NMOS transistor 61 and the drain of the PMOS transistor 62.

The operation of the semiconductor device according to the embodiment with the above-described structure will be discussed below. When a high-level signal is input to the input pad 56, the NMOS transistor 61 is turned off and the PMOS transistor 62 is turned on, so that a high-level signal is input to the internal circuit 63. When a low-level signal is input to the input pad 56, however, the NMOS transistor 61 is turned on and the PMOS transistor 62 is turned off, so that a low-level signal is input to the internal circuit 63.

When the ESD current is input to the input pad 56, the ESD current flows through the ESD protecting element 54 and the ESD protecting element 59 and is discharged to the ground-potential wire 55 and the supply-potential wire 60. This can protect the NMOS transistor 61 and the PMOS transistor 62, which are a part of the internal circuit, and the internal circuit 63 against the ESD current. The other operation and effects of the embodiment are the same as those of the first embodiment.

In the fifth embodiment, an ESD protecting element which uses a bipolar transistor or a thyristor may be provided between the ground-potential wire 35 and/or the supply-potential wire 40 and the output pad 36. In this case, In this case, as a ballast resistor is formed at the ESD protecting elements 34 and 39, the supplied ESD current mostly flows into the ESD protecting element which uses a bipolar transistor or a thyristor, and does not flow much into the ESD protecting elements 34 and 39. This can prevent the ESD protecting elements 34 and 39 from being broken. Likewise, an ESD protecting element which uses a bipolar transistor or a thyristor may be provided between the ground-potential wire 55 and/or the supply-potential wire 60 and the input pad 56 in the sixth embodiment.

Figure 18:
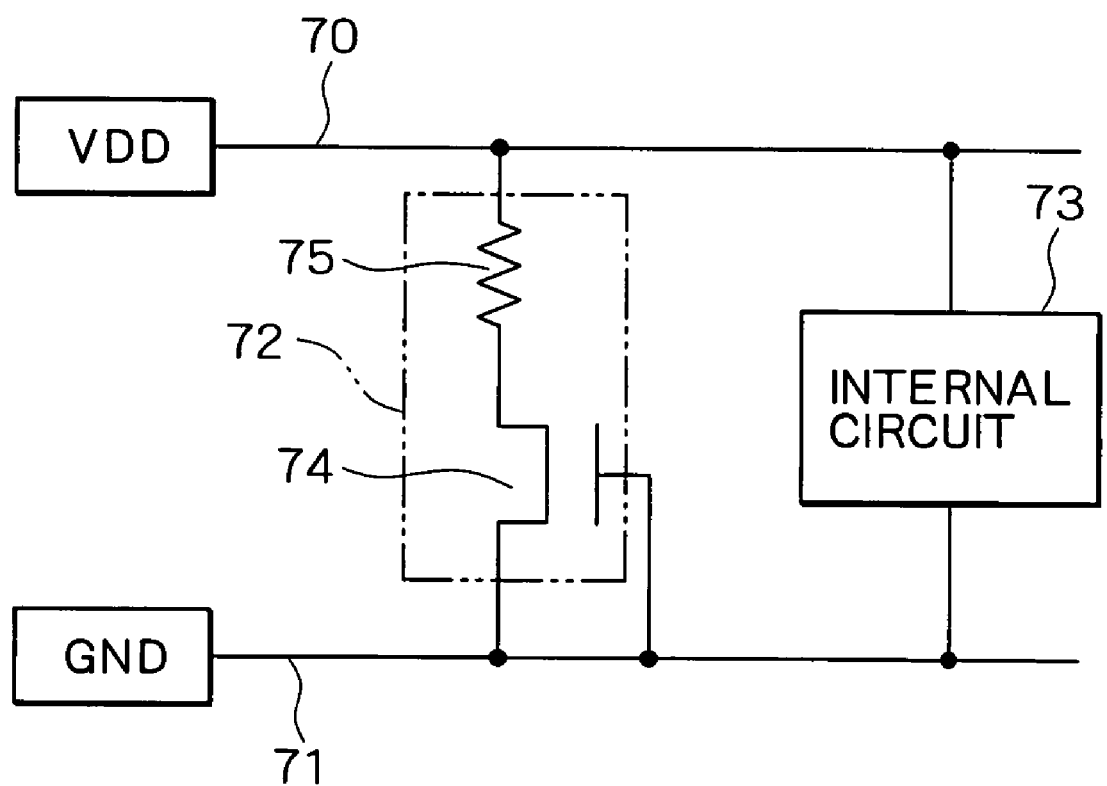
FIG. 18 is a circuit diagram illustrating a semiconductor device according to a seventh embodiment of the invention.

The seventh embodiment of the invention will be described next. FIG. 18 is a circuit diagram illustrating a semiconductor device according to the embodiment. As shown in FIG. 18, an ESD protecting element 72 and an internal circuit 73 are connected in parallel between a supply-potential wire 70 and a ground-potential wire 71. The ESD protecting element 72 is provided with an NMOS transistor 74 and a ballast resistor 75. The source and gate of the NMOS transistor 74 are connected to the ground-potential wire 71, and the drain is connected to one end of the ballast resistor 75. The other end of the ballast resistor 75 is connected to the supply-potential wire 70. The layout of the ESD protecting element 72 is the same as the ESD protecting element in any of the first to fourth embodiments. According to the embodiment, the internal circuit 73 can be protected against the ESD current that is transmitted via the supply-potential wire 70 and the ground-potential wire 71. The gate of the NMOS transistor 74 may be connected to the ground-potential wire 71 directly or via a resistor or a transistor. When the gate of the NMOS transistor 74 is coupled to the ground-potential wire 71 via a resistor or a transistor, the snap-back start voltage of the ESD protecting element 72 can be made lower.

Although the foregoing description of each embodiment has been given of a semiconductor device having an ESD protecting element, the invention is not limited to this case and can be adapted to a variety of semiconductor devices which need a constant resistance in a limited area. The invention is effective particularly to a micro-fabricated semiconductor device which has a high contact resistance.

Figure 1:
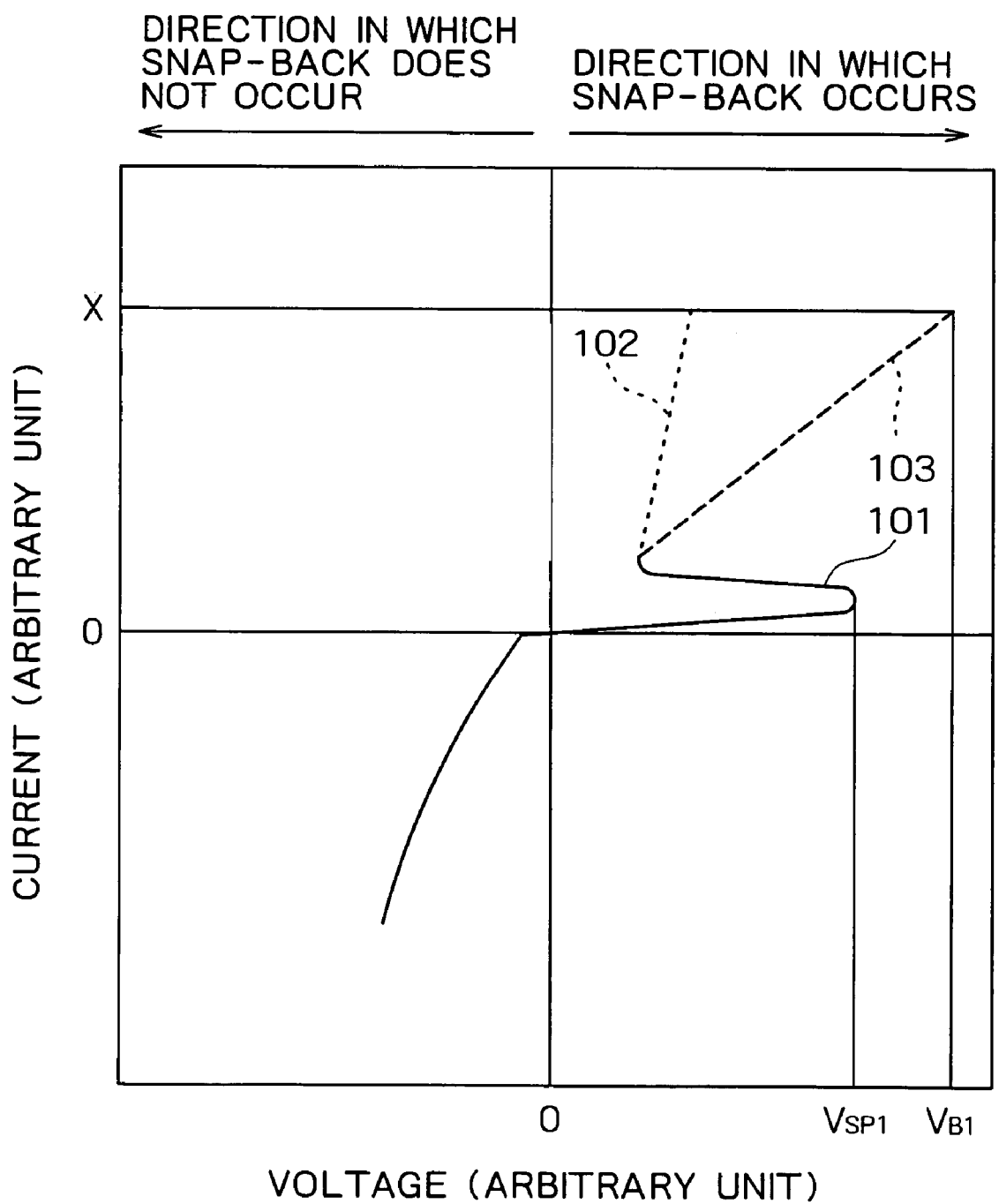
FIG. 1 is a graph showing the operational characteristic of an ESD protecting element with a voltage to be applied to the ESD protecting element taken on the horizontal axis and a current flowing through the ESD protecting element taken on the vertical axis.
Figure 2:
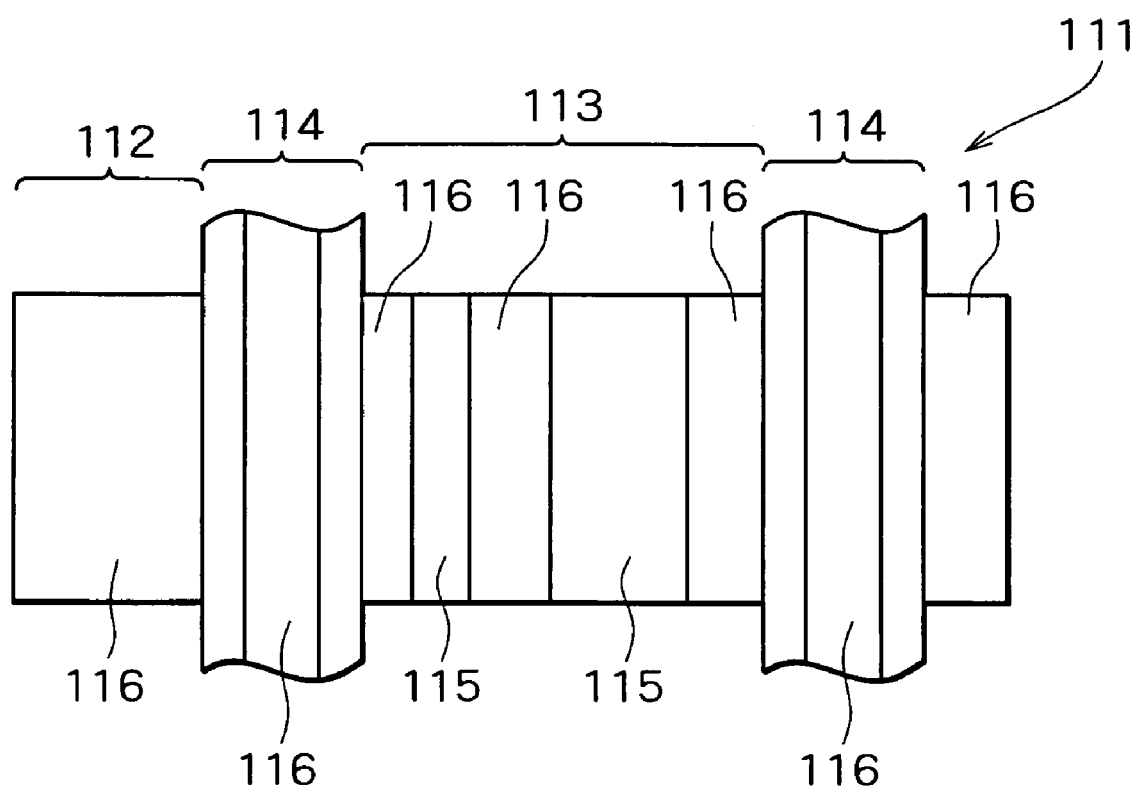
FIG. 2 is a plan view showing a conventional ESD protecting element.
Figure 3:
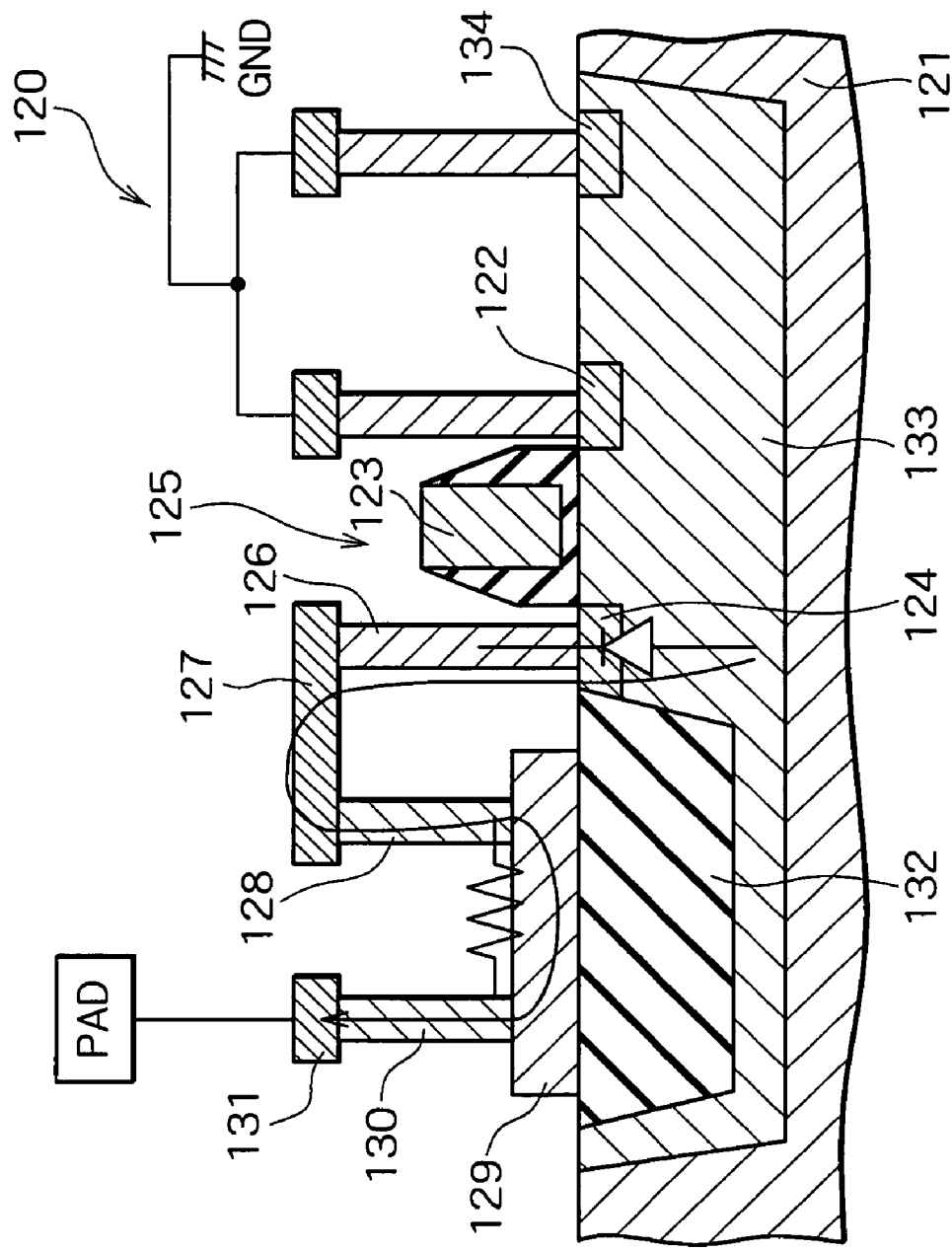
FIG. 3 is a cross-sectional view showing the conventional ESD protecting element.
Figure 19:
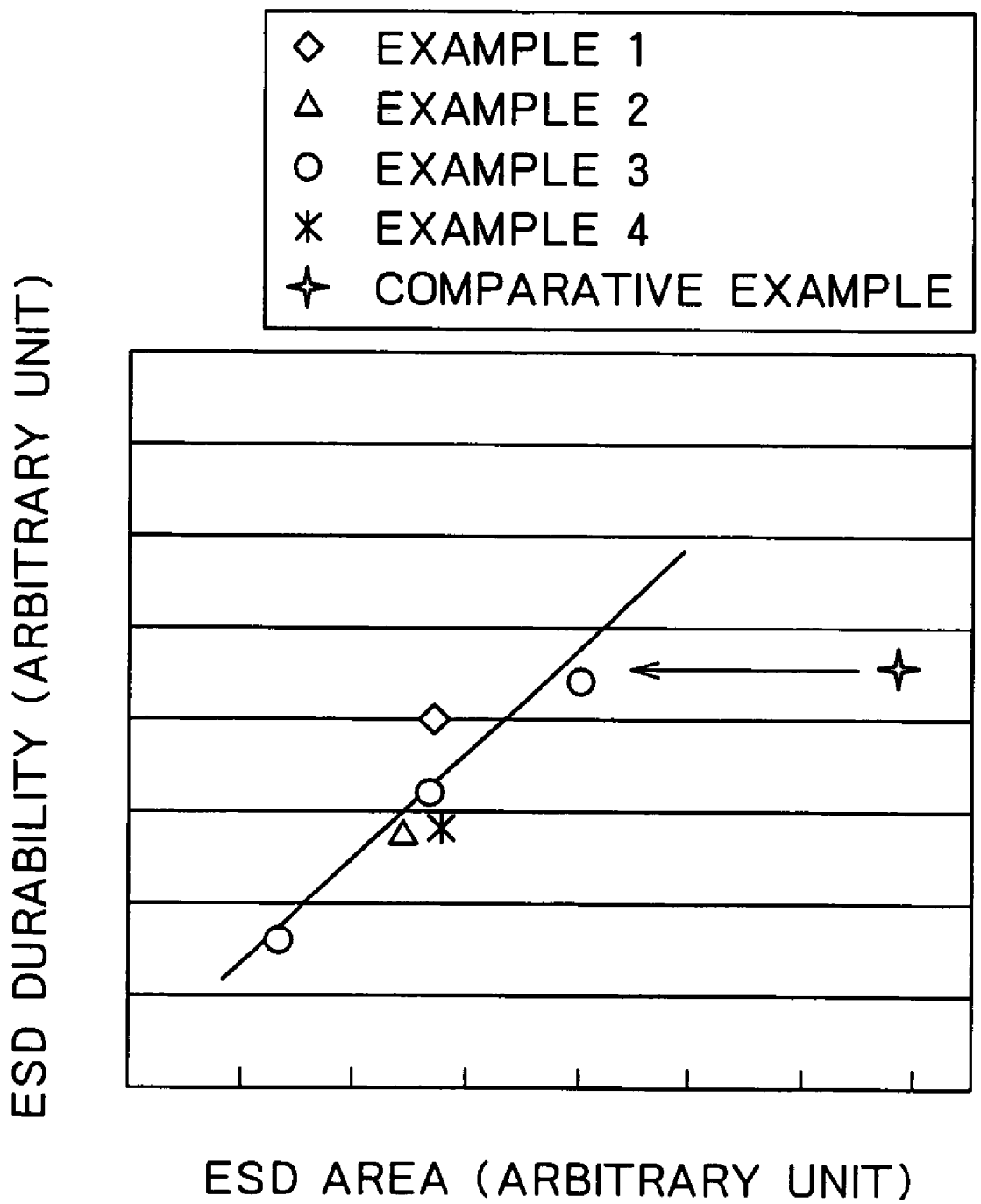
FIG. 19 is a graph showing the performance of an ESD protecting element with the area of the ESD protecting element (ESD area) taken on the horizontal axis and the ESD durability of the ESD protecting element taken on the vertical axis.

The effects of the embodiments of the invention will be specifically discussed in comparison with comparative examples to be discussed later. FIG. 19 is a graph showing the performance of an ESD protecting element with the area of the ESD protecting element (ESD area) taken on the horizontal axis and the ESD durability of the ESD protecting element taken on the vertical axis. The "ESD durability" is an index indicating the ESD drive capability, and is equivalent to the amount of the current that can be let to flow into the ESD protecting element in a short period of time. As Examples 1 to 4 of the invention, the ESD protecting elements according to the first to fourth embodiments were prepared respectively. As a comparative example, a conventional ESD protecting element (see FIG. 2) described in the aforementioned Japanese Patent Laid-Open Publication No. 2001-284583 was prepared. The ESD durabilities of Examples 1 to 4 and the comparative example were evaluated.

As shown in FIG. 19, the ESD durabilities of the ESD protecting elements according to the individual embodiments of the invention were nearly proportional to the respective ESD areas. The larger the ESD area, the greater the ESD durability became. Comparing the comparative example with the ESD protecting element of the embodiment whose ESD durability was similar to that of the comparative example, the ESD area of the ESD protecting element of this embodiment could be reduced to about a half the ESD area of the comparative example.

What is claimed is:

1. A semiconductor device comprising:
   a semiconductor substrate, a top surface of said semiconductor substrate being a first conductivity type;
   a second conductivity type transistor which is formed at said top surface of said semiconductor substrate;
   a second conductivity type diffusion layer formed at a position insulated from said second conductivity type transistor at said top surface of said semiconductor substrate;
   a wire;
   a first contact which couples a pad to said second conductivity type diffusion layer;
   a second contact which couples said second conductivity type diffusion layer to said wire; and a third contact which couples said wire to one of source and drain of said second conductivity type transistor, wherein said wire and said second conductivity type diffusion layer have respective longitudinal axes that are transverse to each other, and a direction from said first contact toward said second contact is a widthwise direction of a gate of said second conductivity type transistor.

2. The semiconductor device according to claim 1, further comprising an integrated circuit portion coupled to said pad in parallel to said second conductivity type transistor, and wherein when an electrostatic discharge current is input to said pad, said second conductivity type transistor allows said electrostatic discharge current to flow.

3. The semiconductor device according to claim 2, wherein said pad is an output pad of said integrated circuit portion.

4. The semiconductor device according to claim 2, wherein said pad is an input pad of said integrated circuit portion.

5. The semiconductor device according to claim 2, wherein said pad is a power supply pad of said integrated circuit portion.

6. The semiconductor device according to claim 1, wherein a plurality of said second conductivity type transistors are laid out along a lengthwise direction of gates thereof, every adjoining two of said second conductivity type transistors makes a pair, and a source region is commonized for those second conductivity type transistors which form each pair.

7. The semiconductor device according to claim 6, wherein in every adjoining two of said second conductivity type transistors of which source regions are not commonized, said wire and said second conductivity type diffusion layer are commonized.

8. The semiconductor device according to claim 7, wherein in said two of second conductivity type transistors of which source regions are not commonized, said first and second contacts are commonized.

9. The semiconductor device according to claim 6, wherein a same signal is applied to gates of said plurality of second conductivity type transistors.

10. The semiconductor device according to claim 1, further comprising:
another second conductivity type diffusion layer formed at a position insulated from said second conductivity type transistor and said second conductivity type diffusion layer at said top surface of said semiconductor substrate;
another wire;
a fourth contact which couples a pad to said another second conductivity type diffusion layer; and
a fifth contact which couples said another second conductivity type diffusion layer to said another wire, and wherein said first contact couples said another wire to said second conductivity type diffusion layer for coupling said pad to said second conductivity type diffusion layer.

11. The semiconductor device according to claim 1, wherein a first conductivity type well is formed at said top surface of said semiconductor substrate, and said second conductivity type transistor and said second conductivity type diffusion layer are formed at a top surface of said first conductivity type well.

12. The semiconductor device according to claim 11, further comprising a first conductivity type diffusion layer connecting said first conductivity type well at a potential of an electrical source.

13. The semiconductor device according to claim 1, further comprising,
a first conductivity type diffusion layer connected to power supply potentials (both of VDD and GND),
wherein a first resistance value of a path formed by the first diffusion layer connected to the power supply potentials, the semiconductor substrate, the first contact, and the pad is smaller than a second resistance value of a path formed by the first diffusion layer connected to the power supply potentials, the semiconductor substrate, the second contact, the second conductivity type diffusion layer, the first contact, and the pad.

14. The semiconductor device according to claim 1, further comprising,
a first conductivity type diffusion layer connected to power supply potentials,
wherein the distance in the lengthwise direction of the gate of the transistor between the first contact and the diffusion layer connected to the power supply potentials and the distance in the lengthwise direction of the gate of the transistor between the second contact and the diffusion layer connected to the power supply potentials are substantially the same.

15. A semiconductor device comprising:
a first conductivity type region formed at a top surface of a semiconductor substrate;
a gate insulating layer formed at a top surface of said first conductivity type region;
a gate electrode provided on said gate insulating layer;
first and second second conductivity type regions respectively formed on both sides of a region directly underlying said gate electrode in said first conductivity type region;
a third second conductivity type region formed at a position insulated and isolated from said first and second second conductivity type regions in said first conductivity type region by an insulating layer;
a wiring layer provided on said first conductivity type region;
first and second contacts provided on said third second conductivity type region; and
a third contact provided on said second second conductivity type region, wherein said first and second contacts are laid out at positions apart from each other, said third second conductivity type region is coupled to a pad via said first contact, and said third second conductivity type region is coupled to said second second conductivity type region via said second contact, said wiring layer and said third contact,
wherein said wire and said second conductivity type diffusion layer have respective longitudinal axes that are transverse to each other, and a direction from said first contact toward said second contact is a widthwise direction of said gate electrode.

16. The semiconductor device according to claim 15, wherein a plurality of said gate electrodes are laid out on said first conductivity type region along a lengthwise direction of said gate electrode, said first second conductivity type region is formed in every other region between regions directly underlying said gate electrodes in said first conductivity type region, said second second conductivity type regions are formed in regions contacting said regions directly underlying said gate electrodes in regions where said first second conductivity type regions are not formed of said regions between regions directly underlying said gate electrodes, said third second conductivity type region is formed between said second second conductivity type regions.

17. The semiconductor device according to claim 15, further comprising an integrated circuit portion formed at said top surface of said semiconductor substrate, and wherein said pad is an output pad of said integrated circuit portion.

18. The semiconductor device according to claim 15, further comprising an integrated circuit portion formed at said top surface of said semiconductor substrate, and wherein said pad is an input pad of said integrated circuit portion.

19. The semiconductor device according to claim 15, further comprising an integrated circuit portion formed at said top surface of said semiconductor substrate, and wherein said pad is a power supply pad of said integrated circuit portion.

20. The semiconductor device according to claim 15, further comprising,
a first conductivity type diffusion layer connected to power supply potentials (both of VDD and GND),
wherein a first resistance value of a path formed by the first diffusion layer connected to the power supply potentials, the first conductivity type region, the first contact, and the pad is smaller than a second resistance value of a path formed by the first diffusion layer connected to the power supply potentials, the semiconductor substrate, the second contact, the second conductivity type diffusion layer, the first contact, and the pad.

21. The semiconductor device according to claim 15, further comprising,
a first conductivity type diffusion layer connected to power supply potentials,
wherein the distance in the lengthwise direction of the gate of the transistor between the first contact and the diffusion layer connected to the power supply potentials and the distance in the lengthwise direction of the gate of the transistor between the second contact and the diffusion layer connected to the power supply potentials are substantially the same.

22. A semiconductor device comprising:
a pad;
a resistor; and
a transistor, wherein said resistor and said transistor are coupled in series with said pad, said resistor is located so that a direction of a current flowing through said resistor is a widthwise direction of a gate of said transistor, and
wherein said resistor is constituted of a diffusion layer located in a position insulated from at least said transistor and a first wire connecting a source or a drain of said transistor and said diffusion layer, wherein said first wire and said diffusion layer have respective longitudinal axes that are transverse to each other and electrical current flowing in said diffusion layer is a widthwise direction of a gate of said transistor.

23. The semiconductor device according to claim 22, wherein said first wire connecting the source or drain of said transistor and said diffusion layer is formed with a plurality of wires, said plurality of wires and said diffusion layer intersect each other, and electrical current flowing in said diffusion layer is in a widthwise direction of the gate of said transistor.

24. The semiconductor device according to claim 22, wherein said resistor further comprises another diffusion layer located in a position insulated from said diffusion layer, and a second wire connecting said diffusion layer and said another diffusion layer, wherein said another diffusion layer and said second wire intersect each other.

25. The semiconductor device according to claim 24, further comprising,
another transistor adjacent to the transistor in the lengthwise direction of the gate of the transistor,
wherein the resistor further comprises a third wire that connects the source and the drain of the another transistor to the another diffusion layer.

26. The semiconductor device according to claim 22, further comprising,
another transistor adjacent to the transistor in the lengthwise direction of the gate of the transistor,
wherein the resistor further comprises a plurality of diffusion layers at positions insulated from the diffusion layer, and insulated from each other, and a plurality of wires connecting the diffusion layer and the plurality of diffusion layers, the plurality of diffusion layers and the plurality of wire are interposed between the transistor and the other transistor, and the diffusion layer adjacent to the other transistor among the plurality of diffusion layers and the source or the drain of the other transistor are connected by a second wire.

27. A semiconductor device comprising:
a semiconductor substrate, a top surface of said semiconductor substrate being a first conductivity type;
a second conductivity type transistor which is formed at said top surface of said semiconductor substrate;
a second conductivity type diffusion layer formed at a position insulated from said second conductivity type transistor at said top surface of said semiconductor substrate;
a wire;
a first contact which couples a pad to said second conductivity type diffusion layer;
a second contact which couples said second conductivity type diffusion layer to said wire;
a third contact which couples said wire to one of source and drain of said second conductivity type transistor;
another wire;
a fourth contact connecting said another wire and said second conductivity type diffusion layer; and
a fifth contact connecting said another wire and one of source and drain of said second conductivity type transistor.

28. The semiconductor device according to claim 27, further comprising,
a first conductivity type diffusion layer connected to power supply potentials (both of VDD and GND),
wherein a first resistance value of a path formed by the first diffusion layer connected to the power supply potentials, the semiconductor substrate, the first contact, and the pad is smaller than a second resistance value of a path formed by the first diffusion layer connected to the power supply potentials, the semiconductor substrate, the second contact, the second conductivity type diffusion layer, the first contact, and the pad.

29. The semiconductor device according to claim 22, further comprising,
a first conductivity type diffusion layer connected to power supply potentials,
wherein the distance in the lengthwise direction of the gate of the transistor between the first contact and the diffusion layer connected to the power supply potentials and the distance in the lengthwise direction of the gate of the transistor between the second contact and the diffusion layer connected to the power supply potentials are substantially the same.

* * * * *